(12) United States Patent
Yoon et al.

(10) Patent No.: US 10,163,518 B2
(45) Date of Patent: Dec. 25, 2018

(54) NON-VOLATILE MEMORY DEVICE FOR READING DATA WITH OPTIMIZED READ VOLTAGE

(71) Applicant: Samsung Electronics Co., Ltd., Suwon-si (KR)

(72) Inventors: Hyun-jun Yoon, Changwon-si (KR); Il-han Park, Suwon-si (KR); Na-young Choi, Hwaseong-si (KR); Seung-hwan Song, Incheon (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/716,404

(22) Filed: Sep. 26, 2017

(65) Prior Publication Data

US 2018/0204624 A1  Jul. 19, 2018

(30) Foreign Application Priority Data

Jan. 13, 2017  (KR) .......................... 10-2017-0006282

(51) Int. Cl.
  *G11C 16/28* (2006.01)
  *G11C 16/04* (2006.01)
  *G11C 16/30* (2006.01)
  *G11C 16/08* (2006.01)
  *G11C 16/26* (2006.01)

(52) U.S. Cl.
  CPC .......... *G11C 16/28* (2013.01); *G11C 16/0458* (2013.01); *G11C 16/0483* (2013.01); *G11C 16/08* (2013.01); *G11C 16/26* (2013.01); *G11C 16/30* (2013.01)

(58) Field of Classification Search
  CPC .. G11C 16/0458; G11C 16/0483; G11C 16/26
  USPC .............. 365/185.2, 185.02, 185.03, 185.17, 365/185.21, 185.24
  See application file for complete search history.

(56) References Cited

U.S. PATENT DOCUMENTS

| | | | |
|---|---|---|---|
| 7,808,831 B2 | 10/2010 | Mokhlesi et al. | |
| 7,889,563 B2 | 2/2011 | Cho et al. | |
| 7,936,601 B2 | 5/2011 | Kang et al. | |
| 8,437,197 B2* | 5/2013 | Takagiwa | G11C 16/3436 365/185.02 |
| 8,837,215 B2 | 9/2014 | Lee | |
| 8,934,301 B2* | 1/2015 | Yun | G11C 16/06 365/185.03 |
| 9,036,412 B2 | 5/2015 | Choi et al. | |

(Continued)

*Primary Examiner* — Tan T. Nguyen
(74) *Attorney, Agent, or Firm* — Muir Patent Law, PLLC

(57) ABSTRACT

Provided is a read method for a nonvolatile memory device for reading data with an optimum read voltage. The read method includes reading data of a first set of memory cells connected to a first word line, by dividing the data of the first set of memory cells into M pages and individually reading data from the M pages. The reading data includes performing an on-chip valley search (OVS) operation on a first valley of two adjacent threshold voltage distributions of the first set of memory cells when reading each of the M pages, and performing a data recover read operation via a read operation on a second word line adjacent to the first word line, based on a result of the OVS operation. In the data recover read operation, a read operation on the first word line is not performed.

21 Claims, 26 Drawing Sheets

(56) References Cited

U.S. PATENT DOCUMENTS

| | | |
|---|---|---|
| 9,036,417 B2 | 5/2015 | Chen et al. |
| 9,117,536 B2 | 8/2015 | Yoon et al. |
| 9,177,659 B2 | 11/2015 | Radke et al. |
| 9,330,775 B2 | 5/2016 | Kim et al. |
| 2009/0207659 A1* | 8/2009 | Song .................. G11C 11/5642 |
| | | 365/185.03 |
| 2009/0238003 A1* | 9/2009 | Namiki .............. G11C 16/0483 |
| | | 365/185.17 |
| 2014/0016410 A1* | 1/2014 | Choi ...................... G11C 16/26 |
| | | 365/185.03 |
| 2014/0126298 A1* | 5/2014 | Jeon .................... G11C 11/5635 |
| | | 365/185.24 |
| 2016/0124805 A1 | 5/2016 | Lee |

\* cited by examiner

NON-VOLATILE MEMORY DEVICE FOR READING DATA WITH OPTIMIZED READ VOLTAGE

CROSS-REFERENCE TO RELATED APPLICATION

This application claims the benefit of Korean Patent Application No. 10-2017-0006282, filed on Jan. 13, 2017, in the Korean Intellectual Property Office, the disclosure of which is incorporated herein in its entirety by reference.

BACKGROUND

The present disclosure relates to a semiconductor device, and lore particularly, to a nonvolatile memory device in which a data recover read operation is performed by optimizing a read voltage for a multi-bit-per-cell.

Flash memories storing multi-bits, that is, two or more bits, per cell have recently been developed. In order to improve reliability of a flash memory, a method of accurately reading data stored in a multi-bit memory cell may be useful.

SUMMARY

The present disclosure provides a read method for a nonvolatile memory device for reading data with an optimum reading voltage for a multi-bit memory cell of the nonvolatile memory device.

According to an aspect of the inventive concept, there is provided a read method for a nonvolatile memory device including a plurality of memory cells each storing M-bit data (M is 3 or an integer greater than 3), and the read method includes reading data of a first set of memory cells connected to a first word line, by dividing the data of the first set of memory cells into M pages and individually reading data from the M pages. The reading data of the first set of memory cells includes performing an on-chip valley search (OVS) operation by performing N sensing operations (N is 3 or more) on a first valley of two adjacent threshold voltage distributions of the first set of memory cells when reading each of the first through Mth pages, and performing a data recover read operation via a read operation on a second word line adjacent to the first word line, based on a result of the OVS operation. In the data recover read operation, a read operation on the selected word line is not performed.

According to another aspect of the inventive concept, there is provided a read method for a nonvolatile memory device including a plurality of memory cells each storing M-bit data (M is 3 or more), and the read method includes reading data of a first set of memory cells connected to a first word line, by dividing the data of the first set of memory cells into M pages and individually reading data from the M pages. The reading data of the first set of memory cells includes performing an on-chip valley search (OVS) operation within the nonvolatile memory device, wherein during the OVS operation, a read voltage with respect to a first valley of two adjacent threshold voltage distributions of the first set of memory cells corresponding to each of first through Mth pages is determined, determining a number of times to perform a sensing operation of a second valley of two adjacent threshold voltage distributions based on a result of the OVS operation of the first valley, and selectively performing a data recover read operation on a second word line adjacent to the first word line based on a result of the OVS operation.

According to another aspect of the inventive concept, there is provided a nonvolatile memory device including a memory cell array including a plurality of memory cells each configured to store M-bit data, arranged in rows and columns, where M is 3 or more, a page buffer unit configured to read data of the plurality of memory cells from the memory cell array, and a control logic unit configured to read data of a first set of memory cells connected to a first word line, by individually reading data of M pages of the first set of memory cells, perform an on-chip valley search (OVS) operation on a first valley of two adjacent threshold voltage distributions of the first set of memory cells when reading each of the M pages, through N sensing operations, where N is 3 or more, determine whether to perform a data recover read operation on a second word line adjacent to the first word line, based on a result of the OVS operation, and determine a number of times to perform a sensing operation of a second valley of two adjacent threshold voltage distributions of the first set of memory cells.

According to still another aspect of the inventive concept, there is provided a read method for a nonvolatile memory device including a plurality of memory cells connected to a plurality of word lines, and the read method includes reading data of a first set of memory cells connected to a first word line. The reading data of the first set of memory cells includes performing an on-chip valley search (OVS) operation by sequentially performing three sensing operations at three respective read voltages for a first valley of two adjacent threshold voltage distributions of the first set of memory cells, based on a first result of the OVS operation, performing one sensing operation at one read voltage selected from the three read voltages for a second valley of two adjacent threshold voltage distributions of the first set of memory cells, and based on a second result of the OVS operation different from the first result, sequentially performing two sensing operations at two respective read voltages selected from the three read voltages for the second valley.

BRIEF DESCRIPTION OF THE DRAWINGS

Embodiments of the inventive concept will be more clearly understood from the following detailed description taken in conjunction with the accompanying drawings in which.

DETAILED DESCRIPTION

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

The embodiments are described, and illustrated in the dr lings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated.

Figure 1:
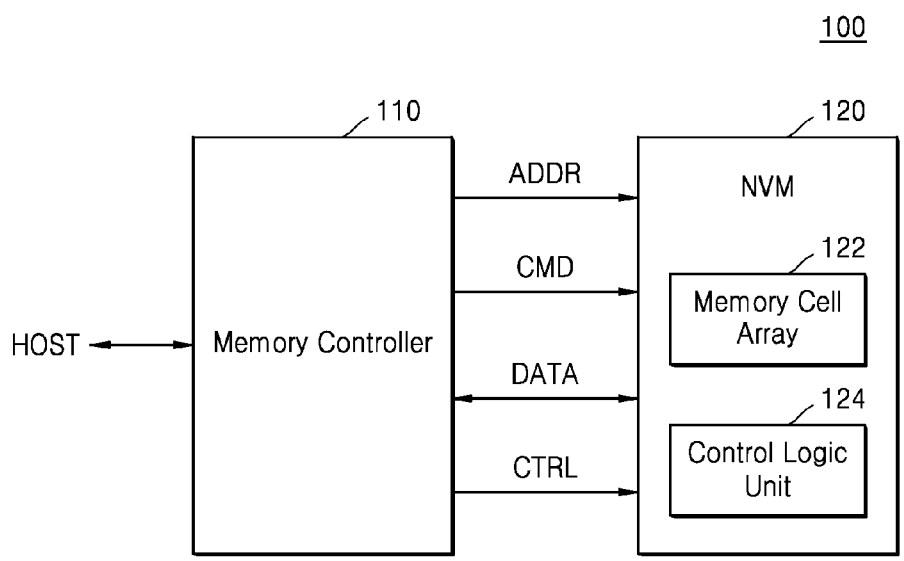
FIG. 1 is a block diagram of a memory system according to example embodiments.

FIG. 1 is a block diagram of a memory system 100 according to example embodiments. Referring to FIG. 1, the memory system 100 includes a memory controller 110 and a nonvolatile memory device 120.

The memory controller 110 may be configured to control the nonvolatile memory device 120 in response to a request from a host. The memory controller 110 may function as an interface between the host and the nonvolatile memory device 120. The memory controller 110 may write data DATA to the nonvolatile memory device 120 or read data DATA stored in the nonvolatile memory device 120.

The memory controller 110 may transmit a command CMD, an address ADDR, a control signal CTRL, and data DATA to the nonvolatile memory device 120 in order to write data DATA to the nonvolatile memory device 120. In order to read data DATA stored in the nonvolatile memory device 120, the memory controller 110 may transmit a command CMD, an address ADDR, and a control signal CTRL to the nonvolatile memory device 120.

The nonvolatile memory device 120 may include nonvolatile memory devices such as a NAND flash memory, a NOR flash memory, a phase change memory (PRAM), a resistive memory (ReRAM), a magnetoresistive RAM (MRAM), etc. According to the inventive concept, a NAND flash memory will be described as the nonvolatile memory device 120. In detail, a charge trap flash memory will be described as the nonvolatile memory device 120.

The nonvolatile memory device 120 may perform operations such as writing, reading and erasing of data DATA in response to signals received from the memory controller 110. The nonvolatile memory device 120 includes a memory cell array 122 including a plurality of memory cells arranged in rows (word lines) and columns (bit lines). Each memory cell may store 1-bit (single bit) data or M-bit (multi-bit) data (M is 2 or more). Each memory cell may be implemented as a memory cell including a charge storage layer such as a floating gate or a charge trap layer or a memory cell including a variable resistor.

The memory cell array 122 may include a planar-type NAND string having a single-layer array structure (or a two-dimensional array structure). Alternatively, the memory cell array 122 may have a multi-layer array structure (or a three-dimensional (3D) array structure). A 3D memory array includes NAND strings that are arranged vertically so that at least one memory cell is disposed above another memory cell. The at least one memory cell may include a charge trap layer.

The nonvolatile memory device 120 includes a control logic unit 124 that controls a read operation such that no read operation is performed on a selected word line (e.g., a first word line) when a data recover read operation is performed on an upper word line (e.g., a second word line) that is adjacent to the selected word line. The control logic unit 124 may determine a number of times to perform a sensing operation that is to be performed at each valley of two adjacent threshold voltage distributions of memory cells during a read operation.

Figure 2:
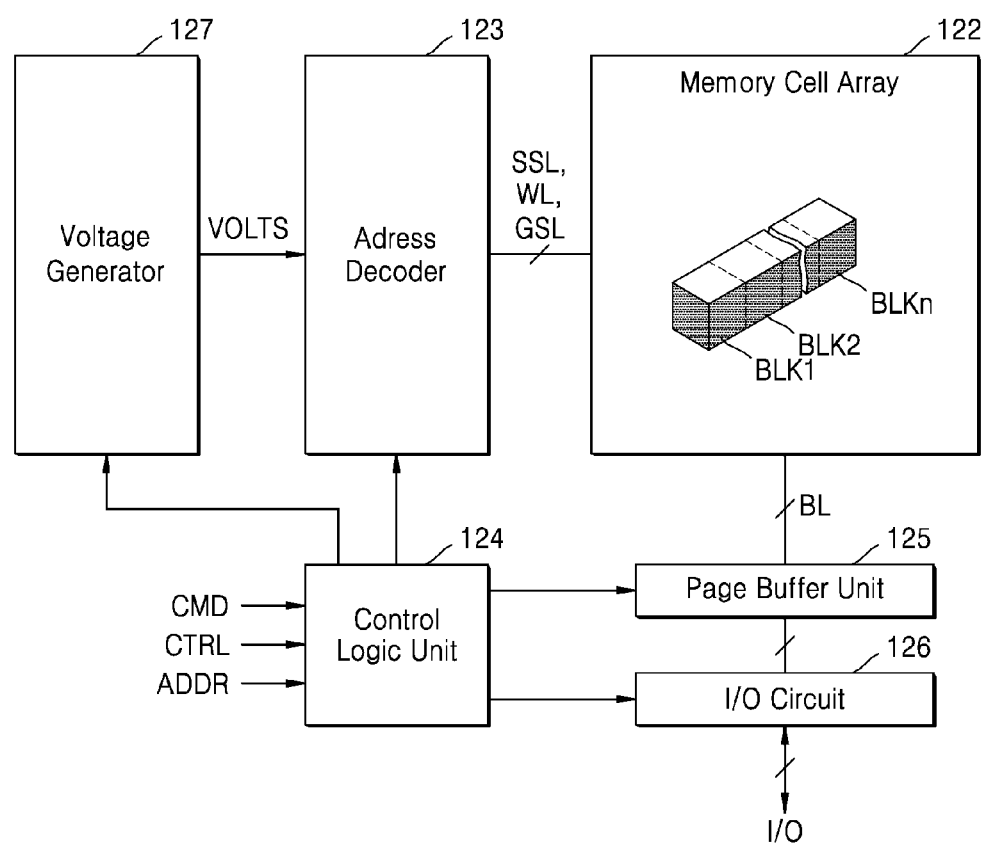
FIG. 2 is a block diagram of a nonvolatile memory device of FIG. 1 according to example embodiments.

FIG. 2 is a block diagram of the nonvolatile memory device 120 of FIG. 1 according to example embodiments. Referring to FIG. 2, the nonvolatile memory device 120 includes a memory cell array 122, an address decoder 123, a control logic unit 124, a page buffer unit 125, an input/output circuit 126, and a voltage generator 127.

The memory cell array 122 may be connected to word lines WL, string select lines SSL, ground select lines GSL, and bit lines BL. The memory cell array 122 may be connected to the address decoder 123 via the word lines WL, the string select lines SSL, and the ground select lines GSL, and may be connected to the page buffer unit 125 via the bit lines BL. The memory cell array 122 may include a plurality of memory blocks BLK1 through BLKn.

Each of the memory blocks BLK1 through BLKn may include a plurality of memory cells and a plurality of selection transistors. The memory cells may be connected to the word lines WL, and the selection transistors may be connected to the string select lines SSL and the ground select lines GSL. The memory cells of each of the memory blocks BLK1 through BLKn may include single-level cells storing 1-bit data or multi-level cells storing M-bit data (for example, M is 3 or an integer greater than 3). Each of the memory blocks BLK1 through BLKn may be stacked perpendicularly to a substrate so as to form a 3D structure. The structure of the memory blocks BLK1 through BLKn will be described in more detail with reference to FIGS. 3 and 4.

The address decoder 123 may select one of the plurality of memory blocks BLK1 through BLKn of the memory cell array 122. The address decoder 123 is configured to perform selection and driving operations on word lines WL of a selected memory block. In a read operation, the address decoder 123 may transmit a select read voltage VR to a selected word line, and transmit a non-select read voltage Vread to a non-selected word line.

The control logic unit 124 may receive a command CMD, an address signal ADDR and a control signal CTRL from the memory controller 110. The control logic unit 124 may provide a plurality of control signals CTLs to the voltage generator 127 and a page buffer control signal PBC to the page buffer unit 125 based on the command CMD and control signal CTRL. The control logic unit 124 may also provide a row address R_ADDR to the address decoder 123 and a column address C_ADDR to the input/output circuit 126 based on the address signal ADDR. For example, the control logic unit 124 may control the address decoder 123, the page buffer unit 125, and the input/output circuit 126 such that data DATA stored in the memory cell array 122 is output in response to a command CMD and a control signal CTRL.

In a read operation on memory cells storing M-bit data, the control logic unit 124 may control the read operation such that data is read individually from M pages of memory cells connected to a selected word line to be stored in the page buffer unit 125. When reading each of first through Mth pages, the control logic unit 124 may perform sensing operations at some valleys (e.g., at least a first valley) of two adjacent threshold voltage distributions of memory cells. When reading each of the first through Mth pages, the control logic unit 124 may perform an on-chip valley search (OVS) operation on one of valleys (e.g., the first valley) of two adjacent threshold voltage distributions of the first through Mth pages. The control logic unit 124 may perform an OVS operation via N times of sensing operations (for example, N is 3 or more). In example embodiments, according to a result of an OVS operation, the control logic unit 124 may determine whether a data recover read operation is necessary on an upper word line adjacent to the selected word line. In other example embodiments, according to a result of an OVS operation, the control logic unit 124 may determine a number of times to perform a sensing operation of a second valley of two adjacent threshold voltage distributions in the selected word line.

When it is determined that a data recover read operation is not needed, the control logic unit 124 may determine the number of times to perform a sensing operation on the rest of the valleys (e.g., second valleys) of some of threshold voltage distributions during reading of a corresponding page. For example, the control logic unit 124 may set the number of times to perform a sensing operation to be performed on the rest of the valleys, to one time.

When it is determined that a data recover read operation is needed, the control logic unit 124 may perform a data recover read operation via a read operation on the upper word line (e.g., a word line adjacent to the selected word line), and may control the data recover read operation such that a read operation is not performed on the selected word line. In addition, when a data recover operation is determined as necessary, the control logic unit 124 may set the number of times to perform a sensing operation, to (N−1) times, to be performed on the rest of the valleys of some of the threshold voltage distributions during reading of a corresponding page.

The control logic unit 124 may control the voltage generator 127 that generates various voltages (e.g., VOLTS) needed for an operation of the nonvolatile memory device 120. For example, the voltage generator 127 may generate, according to control of the control logic unit 124, various types of voltages such as a plurality of select read voltages, a plurality of non-selected read voltages, a plurality of program voltages, a plurality of pass voltages, and a plurality of erase voltages, and provide the voltages to the address decoder 123 and the memory cell array 122.

The page buffer unit 125 may operate as a write driver or a sense amplifier according to an operating mode. During a read operation, the page buffer unit 125 may sense a bit line BL of a memory cell selected according to the page buffer control signal PBC of the control logic unit 124. Sensed data may be stored in latches included in the page buffer unit 125. The page buffer unit 125 may dump the data stored in the latches to the input/output circuit 126 according to control of the control logic unit 124.

The input/output circuit 126 may temporarily store a command CMD, an address ADDR, a control signal CTRL, and data DATA provided via an input/output line I/O from the outside of the nonvolatile memory device 120. The input/output circuit 126 may temporarily store read data of the nonvolatile memory device 120 and output the data to the outside via the input/output line I/O at a set time.

Figure 3:
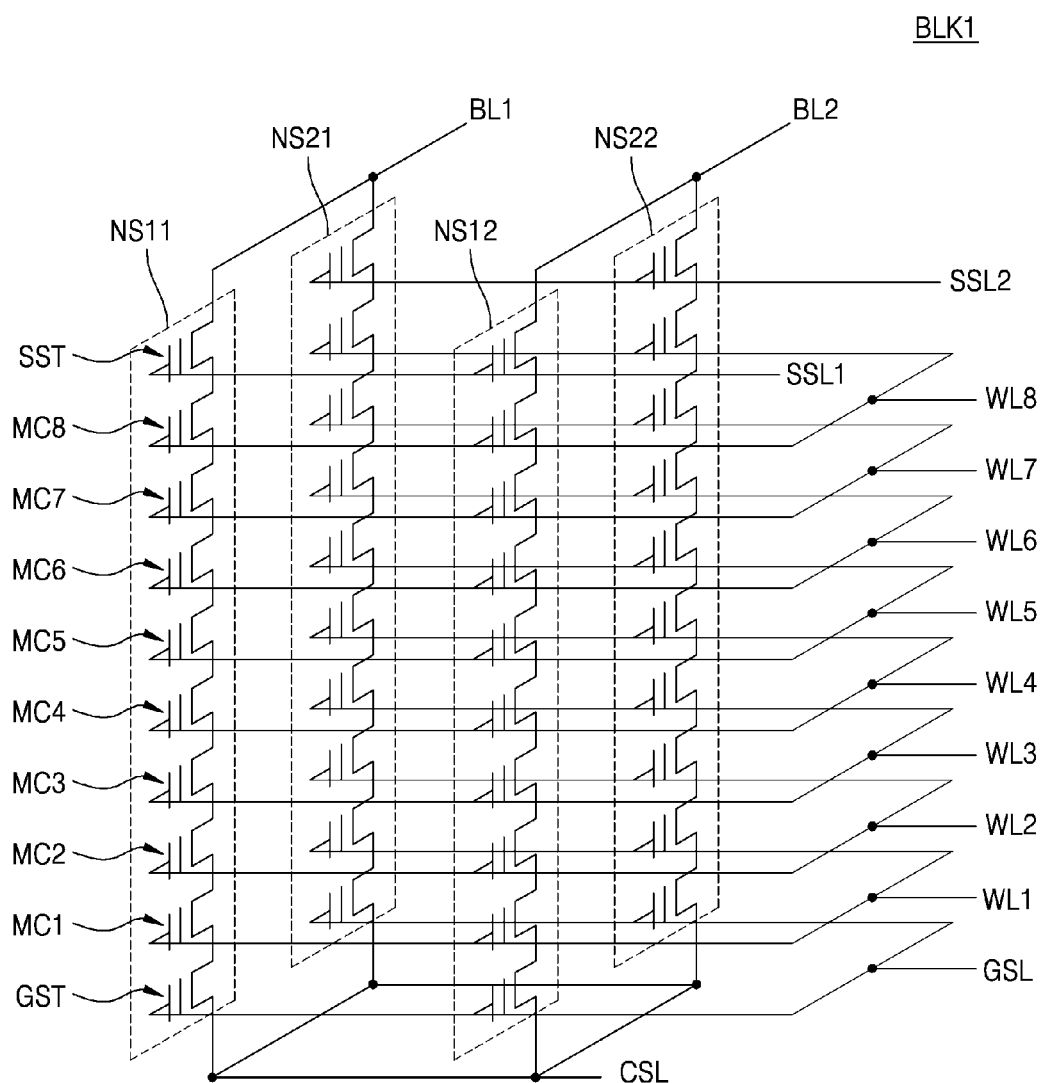
FIG. 3 is a circuit diagram of an example of a memory cell array of FIG. 2.

FIG. 3 is a circuit diagram of an example of the memory cell array 122 of FIG. 2. While a portion of a first memory block BLK1 is described with reference to FIG. 3 from among the memory blocks BLK1 through BLKn, the example embodiments of the inventive concept are not limited thereto. Second through nth memory blocks BLK2 through BLKn may also have the same structure as the first memory block BLK1.

The first memory block BLK1 may include a plurality of NAND strings NS11 through NS22, a plurality of word lines WL1 through WL8, a plurality of bits lines BL including first and second bit lines BL1 and BL2, ground select lines GSL, first and second string select lines SSL1 and SSL2, and a common source line CSL. A string select line SSL may be separated into the first and second select lines SSL1 and SSL2. The number of NAND strings, the number of word lines, the number of bit lines, the number of ground select lines, and the number of string select lines may be varied in various manners according to example embodiments.

The NAND strings NS11 and NS21 are provided between the first bit line BL1 and the common source line CSL, and the NAND strings NS12 and NS22 are provided between the second bit line BL2 and the common source line CSL. Each NAND string (for example, the NAND string NS11) may include a string select transistor SST, a plurality of memory cells MC1 through MC8, and a ground select transistor GST that are connected in series.

NAND strings that are commonly connected to one bit line constitute one column. For example, NAND strings NS11 and N21 commonly connected to the first bit line may correspond to a first column, and the NAND strings NS12 and NS22 commonly connected to the second bit line BL2 may correspond to a second column.

NAND strings connected to one string select line constitute one row. For example, the NAND strings NS11 and NS12 connected to the first string select line SSL1 may correspond to a first row, and the NAND strings NS21 and NS22 connected to the second string select line SSL2 may correspond to a second row.

The string select transistor SST is connected to the first string select line SSL1 or the second string select line SSL2. The plurality of memory cells MC1 through MC8 are respectively connected to first through eighth word lines WL1 through WL8. The ground select transistor GST is connected to the ground select line GSL. The string select transistor SST is connected to the bit lines BL1 and BL2, and the ground select transistor GST is connected to a common source line CSL.

The number of columns of NAND strings may be increased or decreased. As the number of columns of the NAND strings is modified, the number of bit lines connected to the columns of the NAND strings and the number of the NAND strings connected to each string select line may also be modified. The height of the NAND strings may be increased or decreased. For example, the number of memory cells stacked in each of the NAND strings may be increased or decreased.

Figure 4:
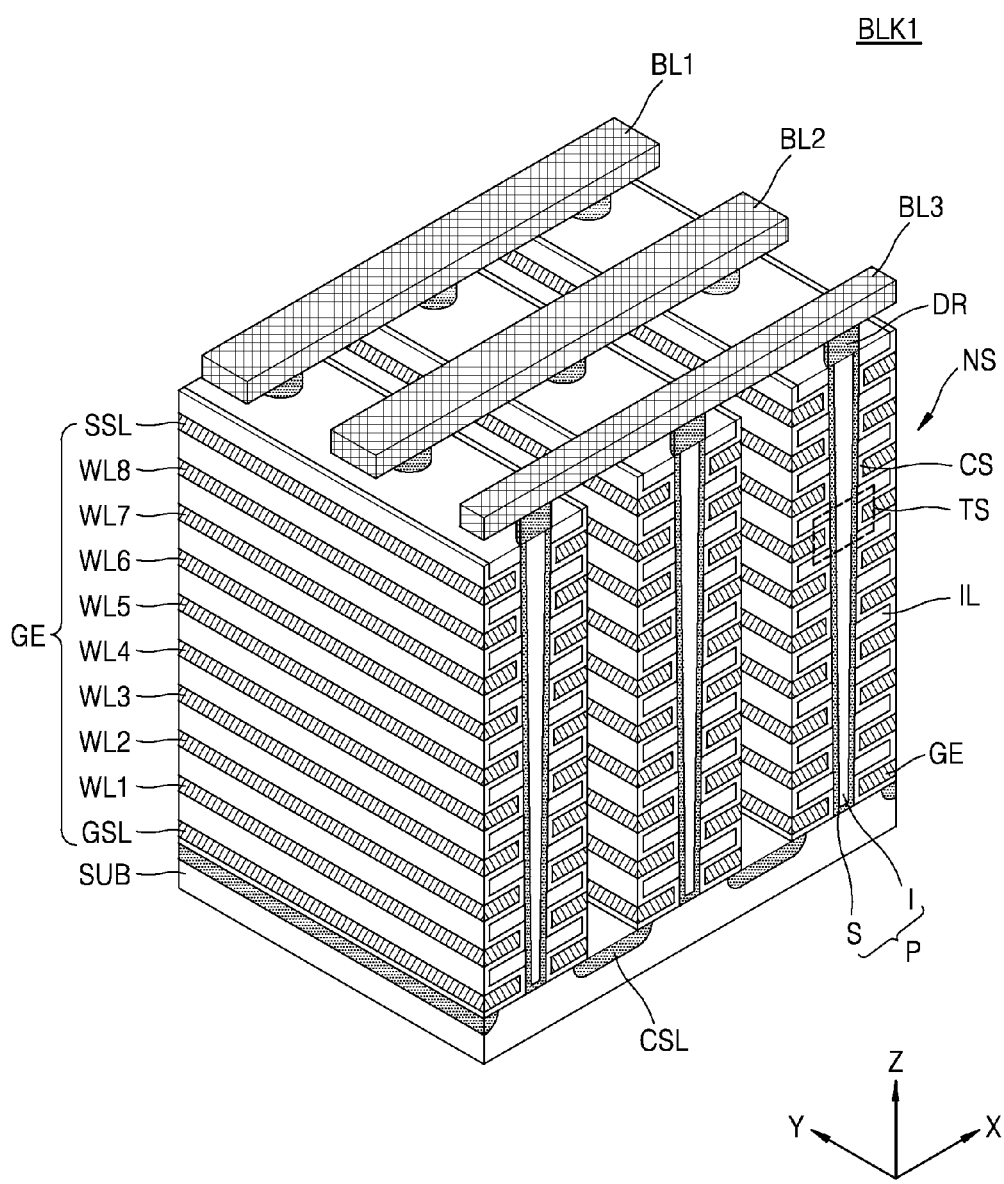
FIG. 4 is a perspective view illustrating the memory cell array of FIG. 3.

FIG. 4 is a perspective view illustrating the memory cell array of FIG. 3.

Referring to FIG. 4, the first memory block BLK1 is disposed in a direction perpendicular to a substrate SUB. While the first memory block BLK1 illustrated in FIG. 4 includes two select lines, that is, a ground select line GSL and a string select line SSL, eight word lines WL1 through WL8, and three bit lines BL1 through BL3, the number of these lines may be increased or reduced.

The substrate SUB may be of a first conductivity type (for example, a p-type), and may extend in a first direction (for example, a Y-direction) on the substrate SUB, and a common source line CSL doped with second conductivity type (for example, n-type) impurities may be provided in the substrate SUB. A plurality of insulation layers IL extending in the first direction are sequentially provided in a third direction (for example, a Z direction) on a region of the substrate SUB between two adjacent common source lines CSL. The plurality of insulation layers IL are spaced apart from one another in the third direction by a predetermined distance. For example, the plurality of insulation layers IL may include an insulation material such as a silicon oxide.

A plurality of pillars P sequentially disposed in the first direction and passing through the plurality of insulation layers IL in the third direction are provided on a region of the substrate SUB between two adjacent common source lines CSL. For example, the plurality of pillars P may pass through the plurality of insulation layers IL to contact the substrate SUB. In detail, a surface layer S of each of the pillars P may include a p-type silicon material, and may function as a channel region. Meanwhile, an internal layer I of each of the pillars P may include an insulation material such as a silicon oxide or an air gap.

A charge storage layer CS is provided in a region between two adjacent common source lines CSL, along exposed surfaces of the insulation layers IL, the pillars P, and the substrate SUB. The charge storage layer CS may include a gate insulation layer (or also referred to as a 'tunnel insulation layer'), a charge trap layer, and a blocking insulation layer. For example, the charge storage layer CS may have an oxide-nitride-oxide (ONO) structure. In addition, gate electrodes GE such as select lines (e.g., a ground select line GSL and a string select line SSL) and word lines (e.g., word lines WL1 through WL8) are provided in a region between two adjacent common source lines CSL, on an exposed surface of the charge storage layer CS.

Drains or drain contacts DR are respectively provided on the plurality of pillars P. For example, drains or drain contacts DR may include a silicon material doped with second conductivity type impurities. Bit lines BL1 through BL3 extending in a second direction (for example, X-direction) and spaced apart from each other in the first direction are provided on drain contacts DR.

The pillars P and the select lines GSL and SSL and the word lines WL1 through WL8 extending in the third direction together form a NAND string NS. The NAND string NS includes a plurality of transistor structures TS. Each of the transistor structures TS may include charge trap flash (CTF) memory cells.

Figure 5A:
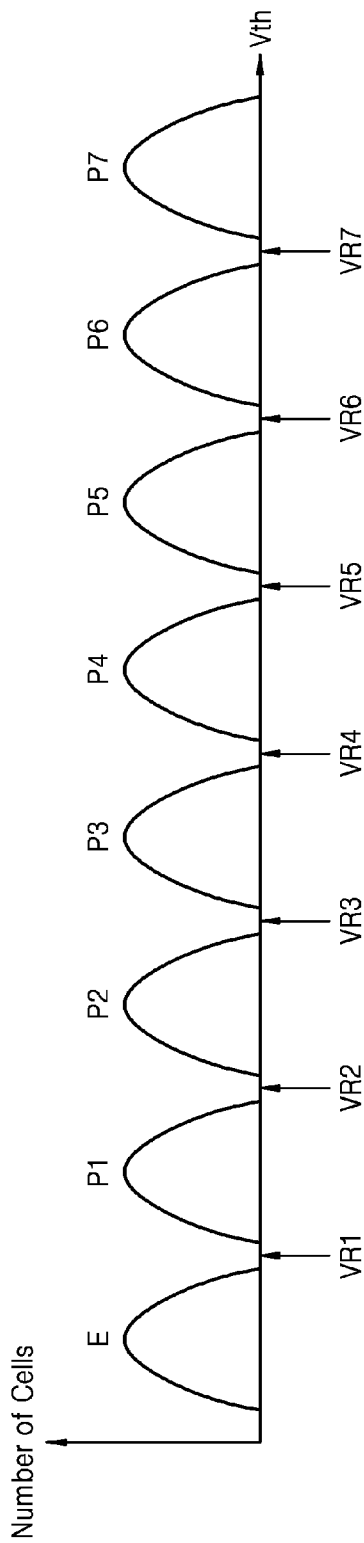
FIGS. 5A and 5B are graphs showing distributions of a threshold voltage of a memory device when a memory cell of FIG. 4 is a 3-bit multi-level cell.
Figure 5B:
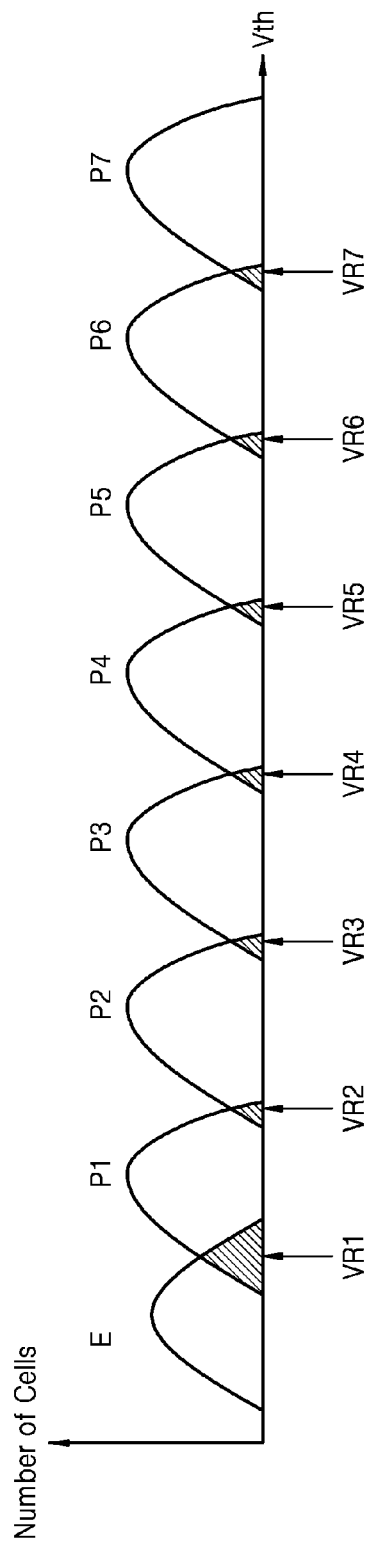

FIGS. 5A and 5B graphs showing distributions of threshold voltages of the nonvolatile memory device 120 when a memory cell MC of FIG. 4 is a 3-bit multi-level cell.

Referring to FIG. 5A, a horizontal axis denotes a threshold voltage Vth, and a vertical axis denotes a number of memory cells MC. When a memory cell MC is a 3-bit multi-level cell programmed with three bits, the memory cell MC may have one of an erase state E, a first program state P1, a second program state P2, a third program state P3, a fourth program state P4, a fifth program state P5, a sixth program state P6, and a seventh program state P7.

A first read voltage VR1 has a voltage level between a distribution of a memory cell MC having the erase state E and a distribution of a memory cell MC having the first program state P1. A second read voltage VR2 has a voltage level between a distribution of a memory cell MC having the first program state P1 and a distribution of a memory cell MC having the second program state P2. A third read voltage VR3 has a voltage level between a distribution of a memory cell MC having the second program state P2 and a distribution of a memory cell MC having the third program state P3. A fourth read voltage VR4 has a voltage level between a distribution of a memory cell MC having the third program state P3 and a distribution of a memory cell MC having the fourth program state P4. A fifth read voltage VR4 has a voltage level between a distribution of a memory cell MC having the fourth program state P4 and a distribution of a memory cell MC having the fifth program state P5. A sixth read voltage VR6 has a voltage level between a distribution of a memory cell MC having the fifth program state P5 and a distribution of a memory cell MC having the sixth program state P6. A seventh read voltage VR7 has a voltage level between a distribution of a memory cell MC having the sixth program state P6 and a distribution of a memory cell MC having the seventh program state P7.

For example, when the first read voltage VR1 is applied to a word line WL of a selected memory cell MC, the memory cell MC which is in the erase state E is turned on, whereas the memory cell MC in the first program state P1 is turned off. When the memory cell MC is turned on, a current flows through the memory cell MC, and when the memory cell MC is turned off, no current flows through the memory cell MC. Accordingly, depending on whether the memory cell MC is turned on or not, data stored in the memory cell MC may be discriminated.

For example, when a memory cell MC is turned on as the first read voltage VR1 is applied thereto, the memory cell MC may be discriminated as storing data '1', and when the memory cell MC is turned off, the memory cell MC may be discriminated as storing data '0'. However, the example embodiments are not limited thereto. According to another example embodiment, when a memory cell MC is turned on as the first read voltage VR1 is applied thereto, the memory cell MC may be discriminated as storing data '0', and when the memory cell MC is turned off, the memory cell MC may be discriminated as storing data '1'. As described above, allocation of logic levels of data may be varied according to example embodiments.

FIG. 5B is a graph showing a threshold voltage shift in a memory cell MC in the graph of FIG. 5A.

Referring to FIG. 5B, memory cells MC that are respectively programmed to the erase state E and the first through seventh program states P1 through P7 may have threshold voltage distributions as modified in FIG. 5B. The threshold voltage distributions may be shifted due to various reasons.

As time passes after a memory cell MC is programmed, charges stored in the charge storage layer CS may be leaked. As programming and erasing of the memory cell MS are conducted more repeatedly, a tunnel insulation layer may be deteriorated to worsen the charge loss. Charges stored in the charge storage layer CS of the memory cell MC may also be leaked due to a high-temperature stress or a temperature difference between programming and reading.

In addition, the memory cell MC may also be influenced by other adjacent memory cells. For example, threshold voltages of memory cells of an nth word line WLn may be shifted when an upper page is programmed to memory cells of an (n+1)th word line that is adjacent to the nth word line WLn. Threshold voltage distributions of memory cells of the nth word line WLn may be widen, due to word line coupling, compared to before the upper page is programmed to the memory cells of an (n+1)th word line. The threshold voltage distributions may be widen because the memory cells of the nth word line WLn selectively experience when the upper page is programmed to the memory cells of the (n+1)th word line.

Figure 6:
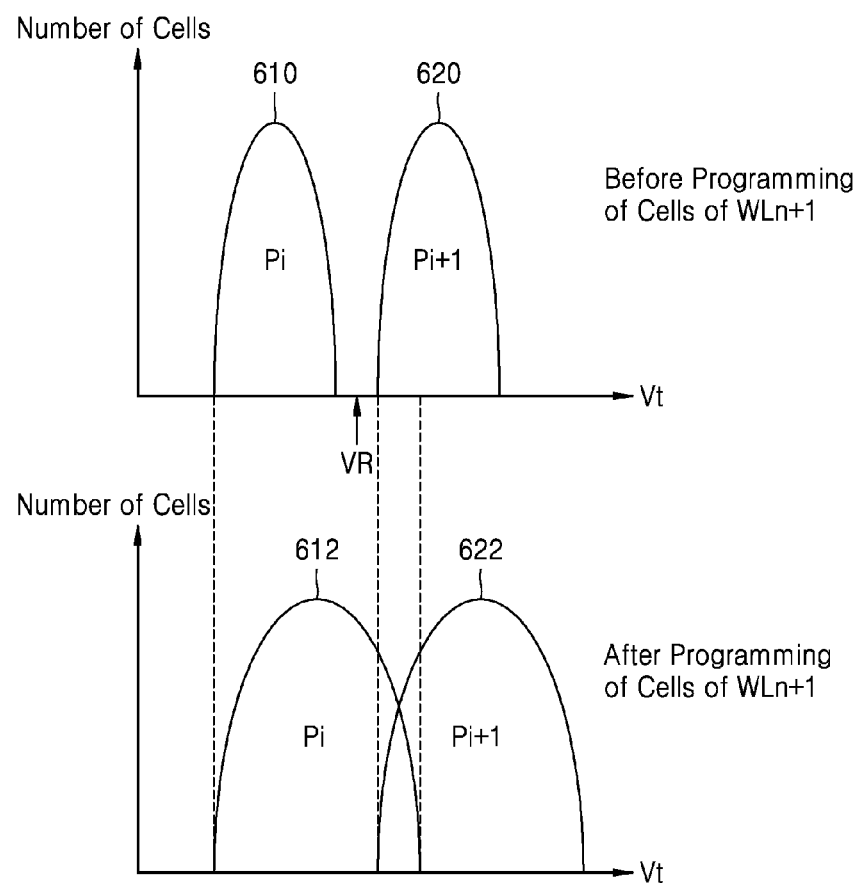
FIG. 6 illustrates a threshold voltage distribution regarding memory cells of an nth word line before and after word line coupling that occurs when memory cells of a (n+1)th word line are programmed.

FIG. 6 illustrates a threshold voltage distribution associated with memory cells of an nth word line before and after word line coupling caused when memory cells of an (n+1)th word line are programmed.

Referring to FIG. 6, two adjacent threshold voltage distributions 610 and 620 that are associated with memory cells of an nth word line WLn before memory cells of an (n+1)th word line are programmed, that is, before word line coupling, are shown. In FIG. 6, only two threshold voltage distributions are illustrated. However, more threshold voltage distributions may exist depending on the number of bits per cell. The number of threshold voltage distributions may be determined based on the number of data bits stored in a memory cell. For example, $2^M$ threshold voltage distributions may be generated when M-bit data (for example, M is 3 or an integer greater than 3) is stored in a memory cell.

The threshold voltage distributions 610 and 620 may be discriminated by using a read voltage VR existing between the threshold voltage distributions 610 and 620. Although not illustrated in the drawings, the other threshold voltage distributions may also be discriminated by using a read voltage existing between adjacent threshold voltage distributions.

The threshold voltage distributions 610 and 620 associated with memory cells of an nth word line WLn may be modified to threshold voltage distributions 612 and 622 after the threshold voltage distributions 610 and 620 experience a threshold voltage shift corresponding to word line coupling caused when memory cells of the (n+1)th word line are programmed. The threshold voltage distributions 612 and 622 denote the entire threshold voltage distributions with respect to both memory cells experiencing word line coupling caused when the memory cells of the (n+1)th word line are programmed and memory cells not experiencing word line coupling.

Figure 7:
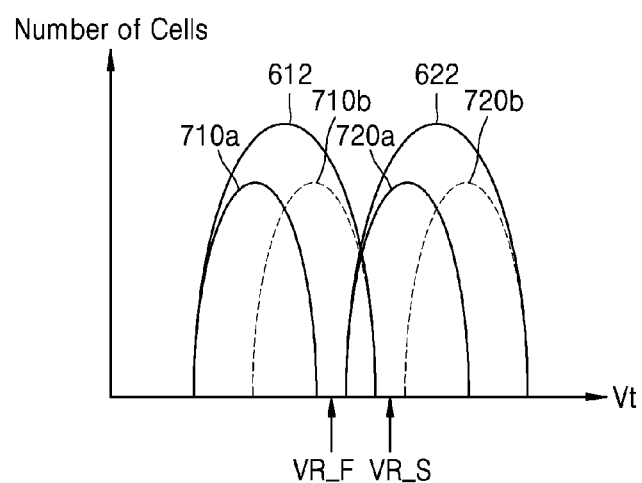
FIGS. 7 and 8 illustrate the threshold voltage distribution of FIG. 6 including coupled and uncoupled memory cells.
Figure 8:
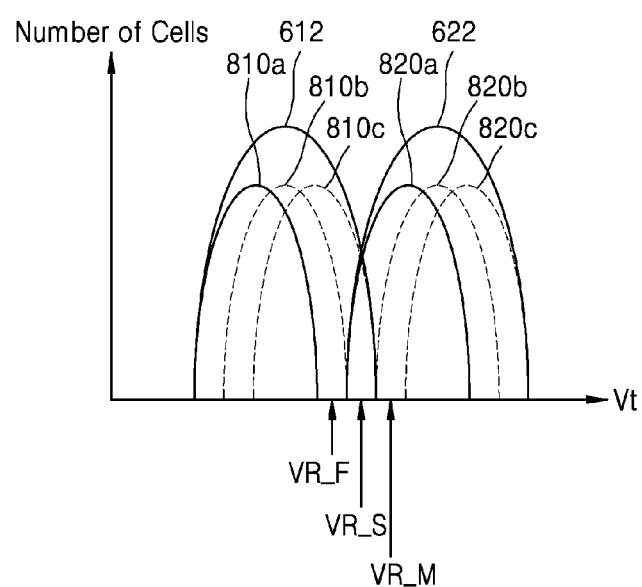

FIGS. 7 and 8 are views for describing the threshold voltage distributions of FIG. 6 including coupled and uncoupled memory cells.

Referring to FIG. 7, threshold voltage distributions 710a and 720a represent threshold voltage distributions of memory cells not experiencing a threshold voltage shift due to word line coupling (or uncoupled memory cells). Threshold voltage distributions 710b and 720b represent threshold voltage distributions of memory cells experiencing a threshold voltage shift due to word line coupling (or coupled memory cells). The threshold voltage distributions 710b and 720b represent a threshold voltage shift of memory cells programmed to data states of the threshold voltage distributions 710a and 720a.

Programmed memory cells of an nth word line may belong, depending on a threshold voltage shift caused due to programming of memory cells of an (n+1)th word line, to the threshold voltage distributions 710a and 720a not experiencing coupling or to the threshold voltage distributions 710b and 720b experiencing coupling. For example, a first read voltage VR_F may be used to discriminate memory cells in the threshold voltage distributions 710a and 720a not experiencing coupling. A second read voltage VR_S may be used to discriminate memory cells of the threshold voltage distributions 710b and 720b experiencing coupling.

Two read operations may be executed with respect to one threshold voltage distribution (or, a data state) using first and second read voltages VR_F and VR_S in order to reduce the read error caused by word line coupling. The number of read operations executed with respect to one data state may be determined according to aggressor cells (or, program states causing coupling).

For example, aggressor cells constitute one group or two or more groups. If aggressor cells constitute one group, a sensing operation may be performed twice. If aggressor cells constitute two groups, a sensing operation may be performed three times. For example, when aggressor cells constitute one group, the aggressor cells may be memory cells programmed to have the program states P1, P3, P5, and P7 illustrated in FIGS. 5A and 5B. When aggressor cells constitute two groups, the aggressor cells may be memory cells programmed to have the program state P1 and memory cells programmed to have the program states P3, P5, and P7 illustrated in FIGS. 5A and 5B.

While here, aggressor cells constituting one group and aggressor cells constituting two groups are described in the present example embodiment, it will be obvious to one of ordinary skill in the art that the number of aggressor cells is not limited thereto. In addition, it will be also obvious that the program states for defining groups including aggressor cells are not limited to the disclosed program states.

Referring to FIG. 8, threshold voltage distributions 810a and 820a represent threshold voltage distributions of memory cells not experiencing a threshold voltage shift due to word line coupling (or uncoupled memory cells). Threshold voltage distributions 810b, 820b, 810c, and 820c represent threshold voltage distributions of memory cells experiencing a threshold voltage shift due to word line coupling (or coupled memory cells). The threshold voltage distributions 810b, 820b, 810c, and 820c represent a threshold voltage shift of memory cells programmed to data states of the threshold voltage distributions 810a and 820a.

Programmed memory cells of an nth word line may belong to the threshold voltage distributions 810a and 820a or to the threshold voltage distributions 810b, 820b, 810c, and 820c according to a threshold voltage shift caused due to programming of memory cells of an (n+1)th word line. For example, a sensing operation using a first read voltage VR_F may be performed to discriminate memory cells in the threshold voltage distributions 810a and 820a that are not coupled, and a sensing operation using a second read voltage VR_S may be performed to discriminate memory cells in the threshold voltage distributions 810b and 820b that are coupled, and a sensing operation using a third read voltage VR_M may be performed to discriminate memory cells in the threshold voltage distributions 810c and 820c that are coupled.

As a distribution of memory cells MC is varied, an optimum voltage level of the first through third read voltages VR_F, VR_S, and VR_M needed to read data of the memory cells MC is to be modified. When a valley between two adjacent program states Pi and Pi+1 of the memory cells MC is detected and a voltage level corresponding to the detected valley is determined as a read voltage, the read voltage may be an optimum read reference voltage of the nonvolatile memory device 120.

Meanwhile, an optimum read voltage of the nonvolatile memory device 120 may be determined using the memory controller 110 (see FIG. 1). For example, the nonvolatile memory device 120 may receive a read command from the memory controller 110 and then perform a read operation, and transmit read data to the memory controller 110. Next, the nonvolatile memory device 120 may receive a modified read voltage from the memory controller 110, and receive a read command and then perform a read operation, and transmit read data to the memory controller 110, and may repeat these operations. In this case, a long period of time and large amount of power may be needed to determine an optimum read voltage.

If an optimum read voltage may be determined within the nonvolatile memory device 120 without having to transmit data between the memory controller 110 and the nonvolatile memory device 120, data communication between the memory controller 110 and the nonvolatile memory device 120 may be simplified. Here, an operation of detecting a valley between two adjacent program states Pi and Pi+1 of memory cells MC within the nonvolatile memory device 120 will be referred to as an on-chip valley search (OVS) operation. A valley search refers to a valley between two adjacent threshold voltage distributions (or, program states). The valley search may include performing multiple reads to find the valley between two adjacent threshold voltage distributions. A new read level may be based on the location of the valley.

Figure 9:
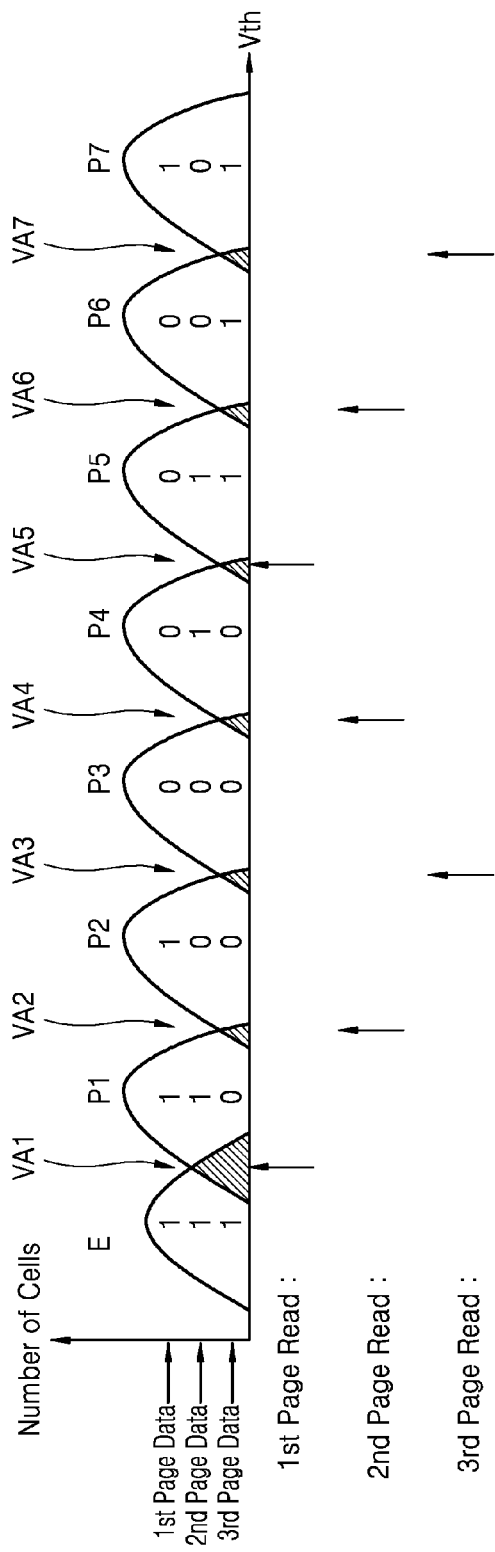
FIG. 9 is a view for describing a read operation for each page of a 3-bit multi-level cell according to example embodiments.

FIG. 9 is a view for describing a read operation for each page of a 3-bit multi-level cell according to example embodiments.

Referring to FIG. 9, when a memory cell MC is a 3-bit multi-level cell, a read operation may be performed on the memory cell MC three times, and eight state information may be output separately on three pages. According to an example embodiment, an erase state E is allocated as data '111'; a first program state P1 may be allocated as data '110'; a second program state P2 may be allocated as data '110'; a third program state P3 may be allocated as data '000'; a fourth program state P4 may be allocated as data '010'; a fifth program state P5 may be allocated as data '011'; a sixth program state P6 may be allocated as data '001'; and a seventh program state P7 may be allocated as data '101'. However, the example embodiments are not limited thereto, and data allocated to the respective program states may be varied according to another example embodiment.

A first page read includes a first read operation on a first valley VA1 between the erase state E and the first program state P1 and a second read operation on a fifth valley VA5 between the fourth program state P4 and the fifth program state P5.

A second page read includes a first read operation on a second valley VA2 between the first program state P1 and the second program state P2, a second read operation on a fourth valley VA4 between the third program state P3 and the fourth program state P4, and a third read operation on a sixth valley VA6 between the fifth program state P5 and the sixth program state P6.

A third page read includes a read operation on a third valley VA3 between the second program state P2 and the third program state P3 and a read operation on a seventh valley VA7 between the sixth program state P6 and the seventh program state P7.

Figure 10:
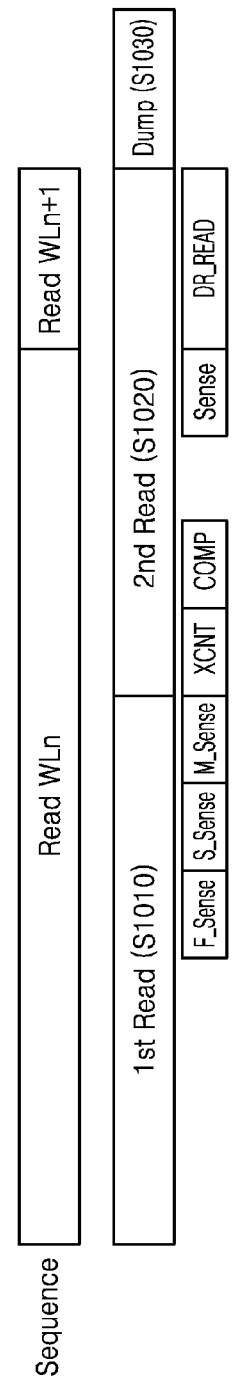
FIG. 10 is a view for describing a sequence of a read operation according to example embodiments.

FIG. 10 is a view for describing a sequence of a read operation according to example embodiments. Referring to FIG. 10, the read operation of the third page read illustrated in FIG. 9 will be described for convenience of description. Description of the read operation of the third page read may also be applied to read operations of the first page read and the second page read.

Referring to FIG. 10, the third page read on a memory cell MC connected to a selected word line WLn includes two read operations S1010 and S1020 and a dumping operation S1030, in which data sensed in the first and second read operations S1010 and S1020 is output from latches of the page buffer unit 125 (FIG. 2) to the input/output circuit 126 (FIG. 2).

According to the present example embodiment, the first read operation S1010 may be a read operation on the seventh valley VA7, and the second read operation S1020 may be a read operation on the third valley VA3. According to an example embodiment, the first read operation S1010 may be performed on the third valley VA3, and the second read operation S1020 may be performed on the seventh valley VA7.

The first read operation S1010 of the third page read may be referred to as an OVS operation. In the first read operation S1010, first through third sensing operations F_SENSE, S_SENSE, and M_SENSE on the seventh valley VA7 may be sequentially performed. During the first sensing operation F_SENSE, data of a memory cell MC may be read using a first read voltage VR7_F, and read data may be stored in a latch of the page buffer unit 125. During the second sensing operation S_SENSE, data of the memory cell MC may be read using a second read voltage VR7_S, and read data may be stored in the latch of the page buffer unit 125. In the third sensing operation M_SENSE, data of the memory cell MC may be read using a third read voltage VR7_M, and read data may be stored in the latch of the page buffer unit 125.

In the second read operation S1020 of the third page read, a count operation XCNT, a determining operation COMP, and a sensing operation SENSE may be sequentially performed. In example embodiments, the count operation XCNT and the determining operation COMP may be included in the first read operation S1010. In the second read operation S1020 of the third page read, a data recover read operation DR_READ may be selectively performed after the sensing operation SENSE. In the count operation XCNT, an XOR operation is performed on data stored in latches of the page buffer unit 125, according to the first through third sensing operations F_SENSE, S_SENSE, and M_SENSE, and an operation of counting a result of the XOR operation may be performed.

In the determining operation COMP, a count value obtained in the count operation XCNT may be compared with first and second reference values A and B. The first reference value A is a parameter determining which of read data among the first through third sensing operations F_SENSE, S_SENSE, and M_SENSE is to be selected and output, and the second reference value B is a parameter determining whether to perform a data recover read operation.

A sensing operation SENSE of a read operation on the third valley VA3 may be controlled based on a comparison result of the determining operation COMP. In addition, a data recover read operation DR_READ on a selectively adjacent upper word line WLn+1 or adjacent lower word line WLn−1 may be controlled based on a comparison result of the determining operation COMP.

In the dumping operation S1030, data sensed in the first and second read operations S1010 and S1020 may be output from latches of the page buffer unit 125 to the input/output circuit 126. For example, in the dumping operation S1030, one of read data of the first through third sensing operations F_SENSE, S_SENSE, and M_SENSE performed in the first read operation S1010 may be selected and output to the input/output circuit 126 based on a comparison result of the determining operation COMP. Also, in the dumping operation S1030, read data of the sensing operation SENSE performed in the second read operation S1020 is output to the input/output circuit 126.

Hereinafter, the first through sensing operations F_SENSE, S_SENSE, and M_SENSE of the first read operation S1010 and the count operation XCNT, the determining operation COMP, the sensing operation SENSE, and the data recover read operation DR_READ of the second read operation S1020, which are the read operations of the third page read will be described in more detail with reference to FIGS. 11A through 11E.

FIGS. 11A through 11E are views for describing an OVS operation according to example embodiments. An OVS operation according to a read operation of the third page read of FIG. 10 will be described with reference to FIGS. 11A through 11E.

Figure 11A:
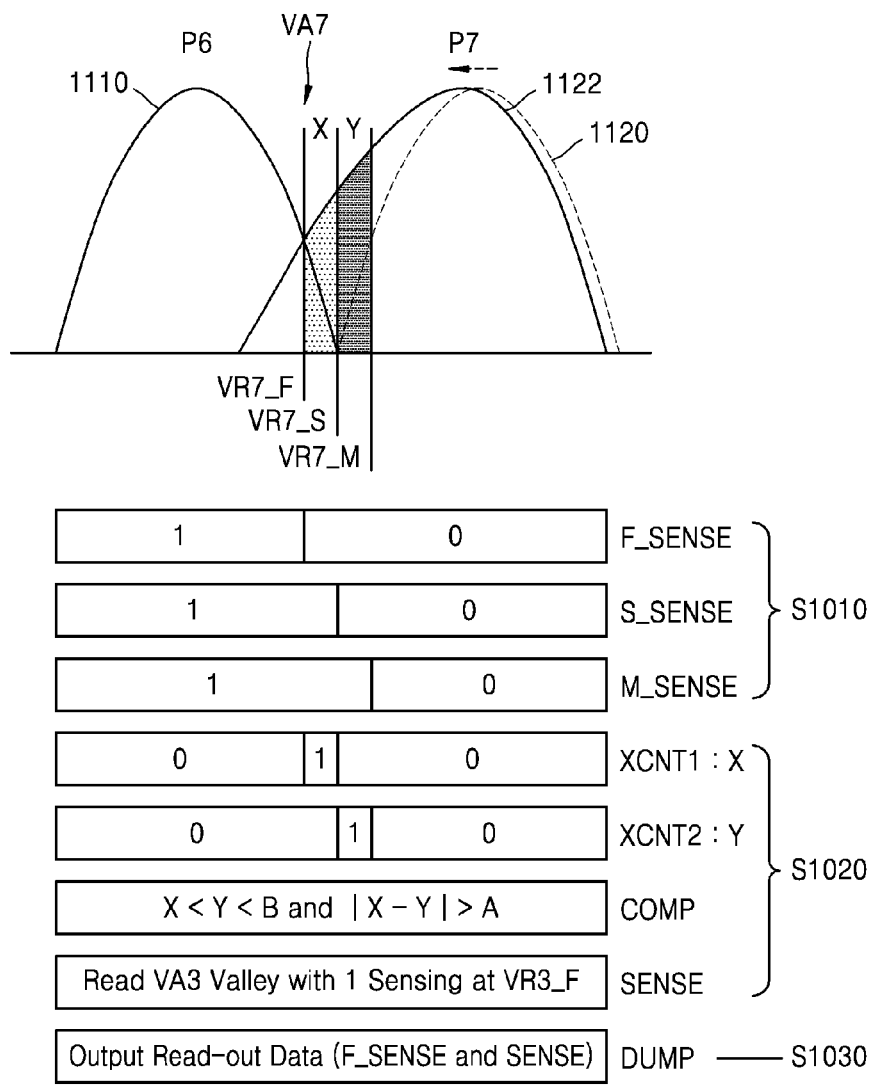
FIGS. 11A through 11E are views for describing an on-chip valley search (OVS) operation according to example embodiments.

Referring to FIG. 11A, threshold voltage distributions 1110 and 1120 of the sixth program state P6 and the seventh program state P7 associated with data of memory cells MC of a selected word line WLn are illustrated. The threshold voltage distributions 1110 and 1120 may deviate toward the threshold voltage distributions that are varied due to a threshold voltage shift caused by, for example, an external stimulus, abrasion, and/or word line coupling. For brevity of the drawings, description will focus on an embodiment in which the threshold voltage distribution 1120 of the seventh program state P7 is deviated to the threshold voltage distribution 1122. According to an example embodiment, the threshold voltage distribution 1110 of the sixth program state P6 may be shifted or the threshold voltage distributions 1110 and 1120 of the sixth and seventh program states P6 and P7 may be both shifted.

In the first read operation S1010 of the third page read, during the first sensing operation F_SENSE, data of a memory cell MC is read with a first read voltage VR7_F. Here, memory cells MC having a lower threshold Vth than the first read voltage VR7_F are read as '1', and memory cells MC having a higher threshold voltage Vth than the first read voltage VR7_F are read as '0'. Data read during the first sensing operation F_SENSE may be stored in latches of the page buffer unit 125.

During the second sensing operation S_SENSE, data of a memory cell MC is read with a second read voltage VR7_S. Here, memory cells MC having a lower threshold voltage Vth than the second read voltage VR7_S are read as '1', and memory cells MC having a higher threshold voltage Vth than the second read voltage VR7_S are read as '0'. Data read during the second sensing operation S_SENSE may be stored in latches of the page buffer unit 125.

In the third sensing operation M_SENSE, data of a memory cell MC is read with a third read voltage VR7_M. Here, memory cells MC having a lower threshold voltage Vth than the third read voltage VR7_M are read as '1', and memory cells MC having a higher threshold voltage Vth than the third read voltage VR7_M are read as '0'. Data read in third first sensing operation M_SENSE may be stored in latches of the page buffer unit 125.

In the second read operation S1020 of the third page read, in a first count operation XCNT1, a first XOR operation may be performed on data read during the first sensing operation F_SENSE and data read during the second sensing operation S_SENSE, and the number X of '1' may be counted from a result of the first XOR operation. A result '1' of the first XOR operation indicates that memory cells having a threshold voltage Vth between the first read voltage VR7_F and the second read voltage VR7_S exist.

In example embodiments, in the first read operation S1010, the first through third sensing operations F_SENSE, S_SENSE, and M_SENSE are consecutively performed.

In a second count operation XCNT2, a second XOR operation may be performed on data read during the second sensing operation S_SENSE and data read in the third sensing operation M_SENSE, and the number Y of '1' may be counted from a result of the second XOR operation result. A result '1' of the second XOR operation indicates that memory cells having a threshold voltage Vth between the second read voltage VR7_S and the third read voltage VR7_M exist.

In the determining operation COMP, a first count value X of the result of the first XOR operation and a second count value Y of the result of the second XOR operation may be compared with the first and second reference values A and B. For example, the second count value Y may be determined to be between the first count value X and the second reference value B (X<Y<B), and an absolute value of a difference between the first count value X and the second count value Y (|X−Y|) may be determined to be greater than the first reference value A. In this case, the first read voltage VR7_F used during the first sensing operation F_SENSE may be determined to be an optimum read voltage of the seventh valley VA7.

As an example, the sensing operation SENSE of the read operation on the third valley VA3 (see FIG. 9) may be set to be performed one-time. A read voltage used during the sensing operation SENSE on the third valley VA3 may be set to a first read voltage VR3_F which corresponds to the first read voltage VR7_F of the seventh valley VA7. In the sensing operation SENSE of the third valley VA3, data of a memory cell MC is read at the first read voltage VR3_F. As an example, memory cells MC having a lower threshold voltage Vth than the first read voltage VR3_F are read as '1', and memory cells MC having a higher threshold voltage Vth than the first read voltage VR3_F are read as '0'. Data read through the sensing operation SENSE may be stored in latches of the page buffer unit 125. For example, the first read voltage VR3_F used during the sensing operation SENSE may be determined to be an optimum read voltage of the third valley VA3.

In a dump operation DUMP, read data of the first sensing operation F_SENSE performed in the first read operation S1010 and read data at the first read voltage VR3_F of the sensing operation SENSE performed in the second read operation S1020 may be output to the input/output circuit 126.

Figure 11B:
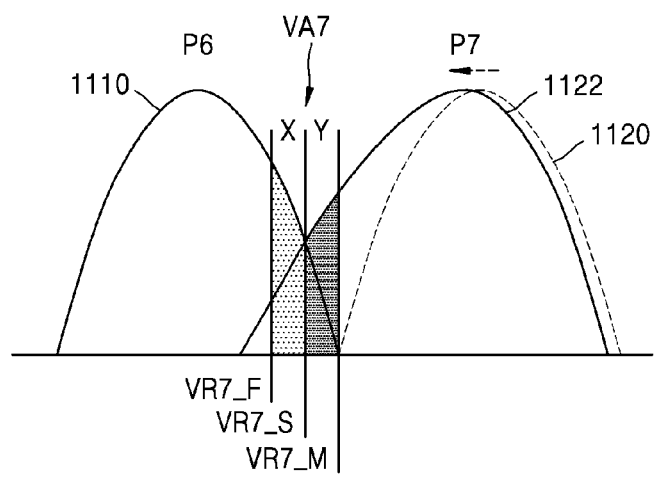

Referring to FIG. 11B, compared to the third page read of FIG. 11A, a read operation of the third page read of FIG. 11B is different from the second read operation S1020 with respect to the determining operation COMP, and the other operations are the same. Hereinafter, description will focus on differences of the third page read of FIGS. 11B through 11E from the third page read of FIG. 11A.

In FIG. 11B, according to the determining operation COMP, the first count value X or the second count value Y may be determined to be smaller than the second reference value B ((X or Y)<B), and an absolute value (|X−Y|) of a difference between the first count value X and the second count value Y may be determined to be smaller than the first reference value A. In this case, the second read voltage VR7_S used during the second sensing operation S_SENSE may be determined as an optimum read voltage of the seventh valley VA7.

In the sensing operation SENSE of a read operation on the third valley VA3 (FIG. 9), a second read voltage VR3_S corresponding to a second read voltage VR7_S of the seventh valley VA7 may be set. In the sensing operation SENSE of the third valley VA3, data of a memory cell MC is read at a second read voltage VR3_S. As an example, memory cells MC having a lower threshold voltage Vth than the second read voltage VR3_S may be read as '1', and memory cells MC having a higher threshold voltage Vth than the second read voltage VR3_S are read as '0'. Data read in the sensing operation SENSE may be stored in latches of the page buffer unit 125. For example, the second read voltage VR3_S used during the sensing operation SENSE may be determined to be an optimum read voltage of the third valley VA3.

In a dump operation DUMP, read data of the second sensing operation S_SENSE performed in the first read operation S1010 and read data at the second read voltage VR3_S of the sensing operation SENSE performed in the second read operation S1020 may be output to the input/output circuit 126.

Figure 11C:
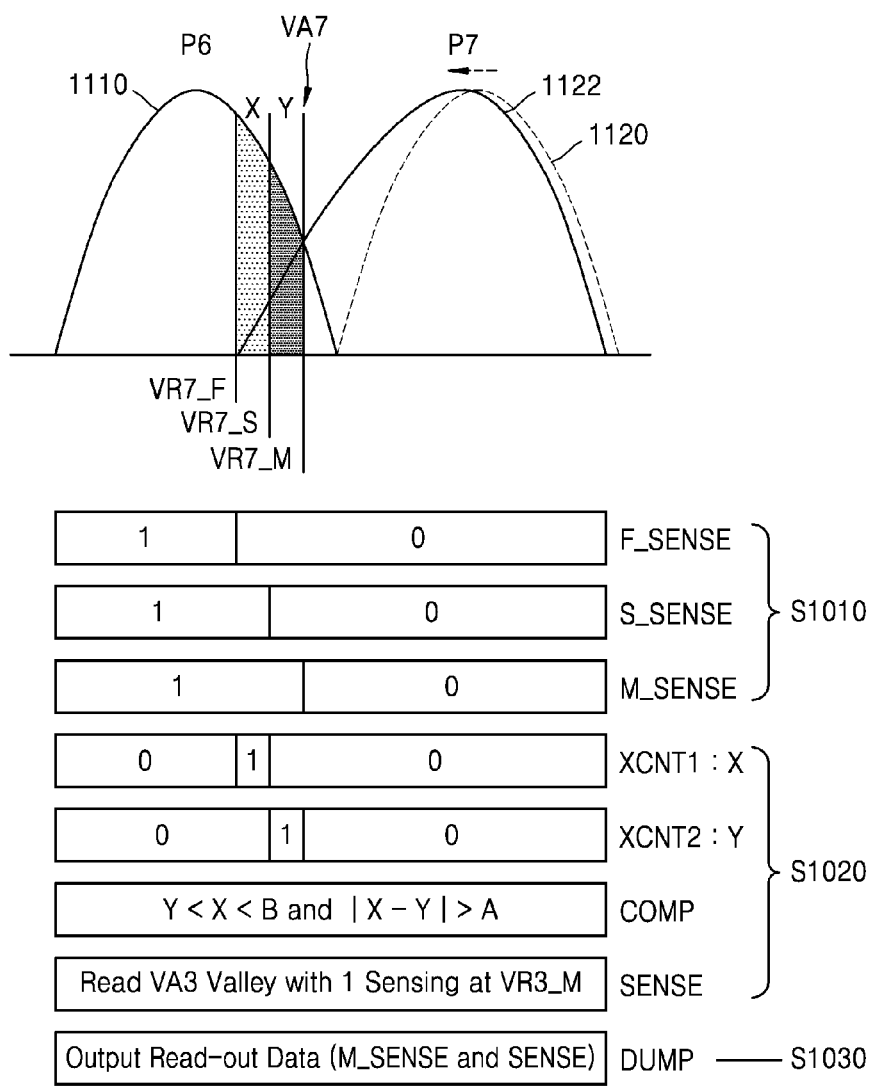

In FIG. 11C, according to the determining operation COMP, the first count value X may be determined to be between the second count value Y and the second reference value B (Y<X<B), and an absolute value (|X−Y|) of a difference between the first count value X and the second count value Y may be determined to be greater than the first reference value A. In this case, the third read voltage VR7_M used in the third sensing operation M_SENSE may be determined as an optimum read voltage of the seventh valley VA7.

In the sensing operation SENSE of the read operation on the third valley VA3, a third read voltage VR3_M corresponding to the third read voltage VR7_M of the seventh valley VA7 may be set. In the sensing operation SENSE of the third valley VA3, data of a memory cell MC is read at the third read voltage VR3_M. As an example, memory cells MC having a lower threshold voltage Vth than the third read voltage VR3_M may be read as '1', and memory cells MC having a higher threshold voltage Vth than the third read voltage VR3_M are read as '0'. Data read in the sensing operation SENSE may be stored in latches of the page buffer unit 125. For example, the third read voltage VR3_M used during the sensing operation SENSE may be determined to be an optimum read voltage of the third valley VA3.

In a dump operation DUMP, read data of the third sensing operation M_SENSE performed in the first read operation S1010 and read data at the third read voltage VR3_M of the sensing operation SENSE performed in the second read operation S1020 may be output to the input/output circuit 126.

Figure 11D:
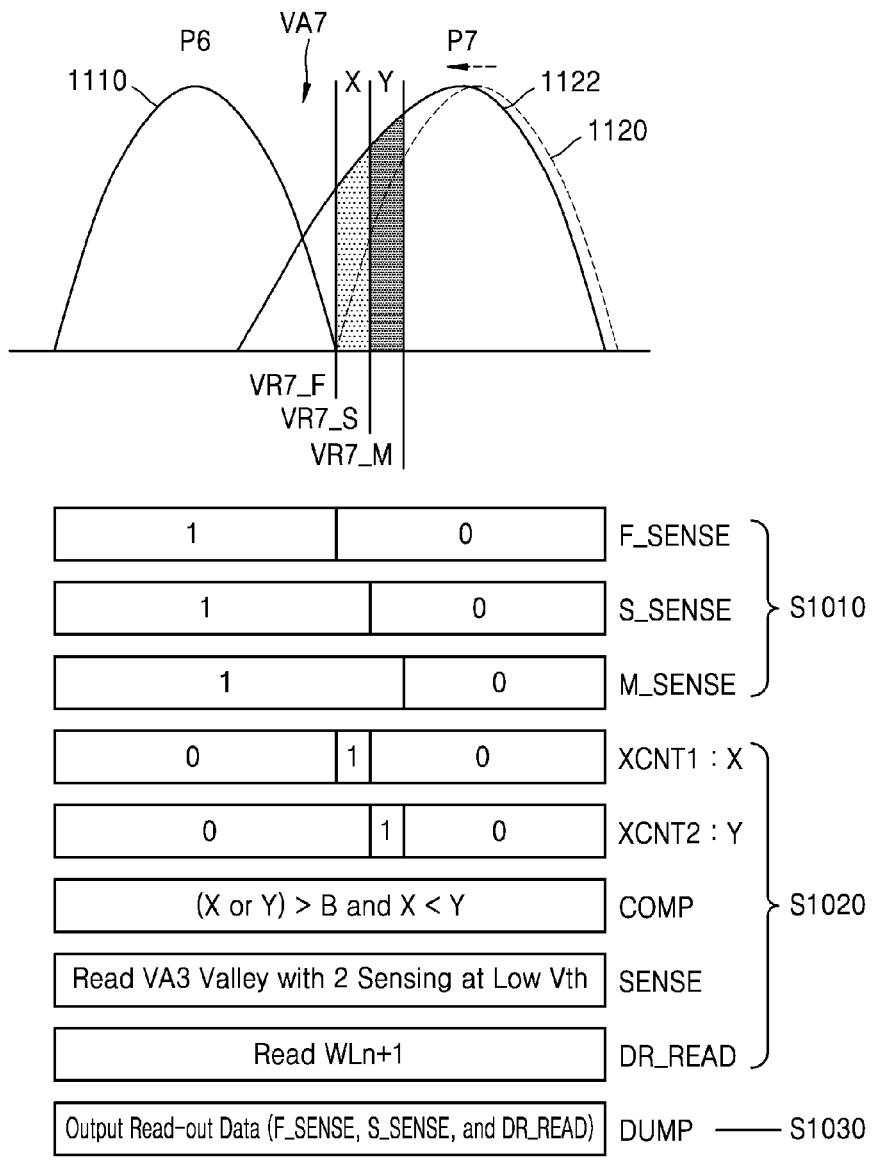

In FIG. 11D, according to the determining operation COMP, the first count value X or the second count value Y may be determined to be greater than the second reference value B ((X or Y)>B), and the first count value X may be determined to be smaller than the second count value Y (X<Y). In this case, a threshold voltage shift of a selected word line WLn may be determined as being deviated toward a low threshold voltage due to word line coupling caused by an adjacent upper word line WLn+1 or an adjacent lower word line WLn−1.

In the determining operation COMP, in order to reduce reading errors due to word line coupling, a data recover read operation on the upper word line WLn+1 may be determined as necessary. Here, relatively low threshold voltages among the first through third read voltages VR7_F, VR7_S, and VR7_M used in the first read operation S1010 may be determined as optimum read voltages. For example, the first read voltage VR7_F used during the first sensing operation F_SENSE and the second read voltage VR7_S used during the second sensing operation S_SENSE may be determined as optimum read voltages of the seventh valley VA7.

In the sensing operation SENSE of the read operation on the third valley VA3 (FIG. 9), first and second read voltages VR3_F and VR3_S corresponding to the first and second read voltages VR7_F and VR7_S of the seventh valley VA7 may be set. In the sensing operation SENSE of the third valley VA3, data of a memory cell MC is sequentially read at the first and second read voltages VR3_F and VR3_S. As an example, memory cells MC having a lower threshold voltage Vth than the first read voltage VR3_F are read as '1', and memory cells MC having a higher threshold voltage Vth than the first read voltage VR3_F are read as '0'. As another example, memory cells MC having a lower threshold voltage Vth than the second read voltage VR3_S are read as '0', and memory cells MC having a higher threshold voltage Vth than the second read voltage VR3_S are read as '1'. Data read in the sensing operation SENSE may be stored in latches of the page buffer unit 125. As an example, the sensing operation SENSE may be consecutively performed at the first and second read voltages VR3_F and VR3_S.

Next, in the data recover read operation DR_READ, a read operation may be performed on an upper word line WLn+1. A read operation on the upper word line WLn+1 may include at least one sensing operation. A sensing operation on the upper word line WLn+1 may be performed using one of the first through seventh read voltages VR1 through VR7 illustrated in FIGS. 5A through 5B or using a predetermined read voltage. For example, a sensing operation on the upper word line WLn+1 may be performed using the fourth read voltage VR4 which is an intermediate voltage among the first through seventh read voltages VR1 through VR7. According to an example embodiment, various read voltages may be set with respect to the sensing operation on the upper word line WLn+1 based on a program state of the upper word line WLn+1 that causes coupling or an amount of coupling. For example, one of the first read voltage VR3_F and the second read voltage VR3_S may be determined as an optimum read voltage of the third valley VA3 based on the program state of the upper word line WLn+1.

In a dump operation DUMP, read data of the two sensing operations F_SENSE, and S_SENSE performed in the first read operation S1010 and read data at the first and second read voltages VR3_F and VR3_S of the sensing operation SENSE performed in the second read operation S1020 may be output to the input/output circuit 126.

Figure 11E:
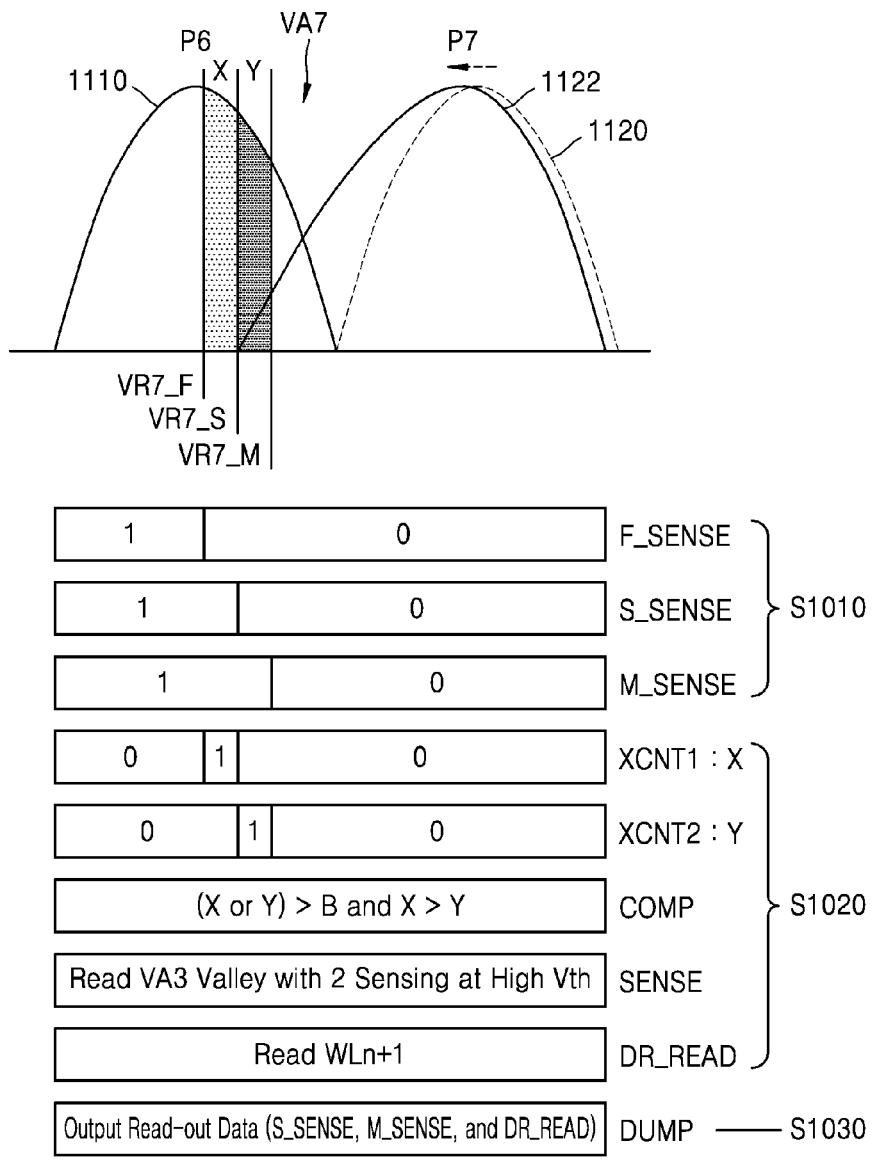

In FIG. 11E, according to the determining operation COMP, the first count value X or the second count value Y may be determined to be greater than the second reference value B ((X or Y)>B), and the first count value X may be determined to be greater than the second count value Y (X>Y). In this case, a threshold voltage shift of a selected word line WLn may be determined as being deviated toward a relatively high threshold voltage due to word line coupling caused by an adjacent upper word line WLn+1.

In the determining operation COMP, in order to reduce reading errors due to word line coupling, a data recover read operation on the upper word line WLn+1 may be determined as necessary. As an example, relatively high threshold voltages Vth among the first through third read voltages VR7_F, VR7_S, and VR7_M used in the first read operation S1010 may be determined as optimum read voltages of the seventh valley VA7. That is, the second read voltage VR7_S used during the second sensing operation S_SENSE and the third read voltage VR7_M used in the third sensing operation M_SENSE may be determined as the optimum read voltages of the seventh valley VA7.

In the sensing operation SENSE of the read operation on the third valley VA3 (FIG. 9), second and third read voltages VR3_S and VR3_M corresponding to the second and third read voltages VR7_S and VR7_M of the seventh valley VA7 may be set. In the sensing operation SENSE of the third valley VA3, data of a memory cell MC is read at the second and third read voltages VR3_S and VR3_M. As an example, memory cells MC having a lower threshold voltage Vth than the second read voltage VR3_S are read as '1', and memory cells MC having a higher threshold voltage Vth than the second read voltage VR3_S are read as '0'. Memory cells MC having a lower threshold voltage Vth than the third read voltage VR3_M are read as '1', and memory cells MC having a higher threshold voltage Vth than the third read voltage VR3_M are read as '0'. Data read at the second and third read voltages VR3_S and VR3_M in the sensing operation SENSE may be stored in a latch of the page buffer unit 125. As an example, the sensing operation SENSE is consecutively performed at the second and third read voltages VR3_S and VR3_M.

Next, in the data recover read operation DR_READ, a read operation on the upper word line WLn+1 may be performed. The read operation on the upper word line WLn+1 may include at least one sensing operation. A sensing operation on the upper word line WLn+1 may be performed using one of the first through seventh read voltages VR1 through VR7 illustrated in FIGS. 5A and 5B or using a predetermined read voltage. For example, a sensing operation on the upper word line WLn+1 may be performed using the fourth read voltage VR4 which is an intermediate voltage among the first through seventh read voltages VR1 through VR7. According to an example embodiment, various read voltages may be set with respect to the sensing operation on the upper word line WLn+1 based on a program state of the upper word line WLn+1 that causes coupling or an amount of coupling. For example, one of the second read voltage VR3_S and the third read voltage VR3_M may be determined as an optimum read voltage of the third valley VA3 based on the program state of the upper word line WLn+1.

In a dump operation DUMP, read data of the two sensing operations S_SENSE and M_SENSE performed in the first read operation S1010 and read data at the second and third read voltages VR3_S and VR3_M of the sensing operation SENSE performed in the second read operation S1020 may be output to the input/output circuit 126.

Figure 12:
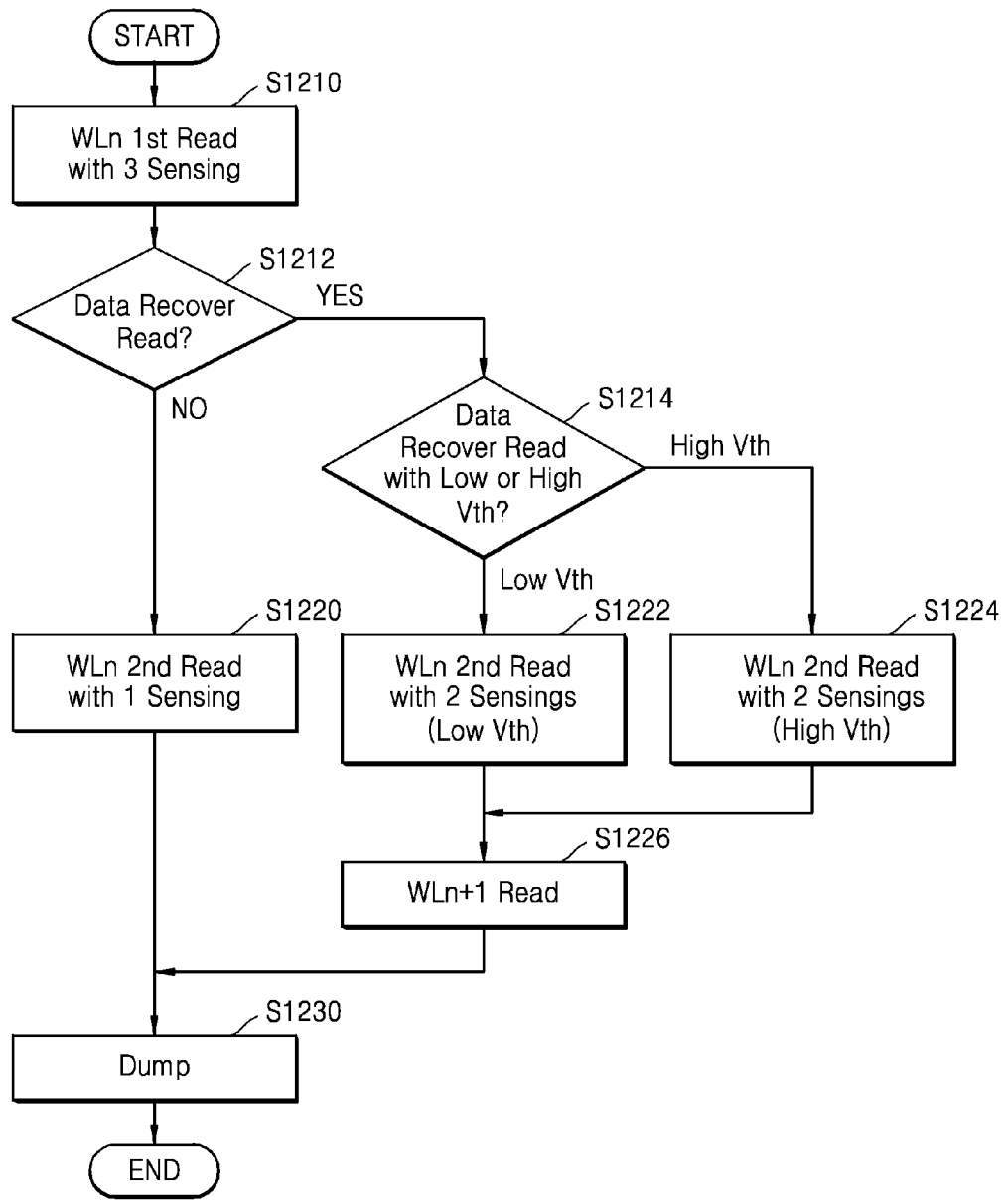
FIG. 12 is a flowchart of a read operation according to example embodiments.

FIG. 12 is a flowchart of a read operation according to example embodiments. FIGS. 13 through 17 are views for describing operations described with reference to FIG. 12 according to example embodiments.

When referring to FIG. 12 in connection with FIG. 10, a read operation of the third page read on a memory cell MC connected to a selected word line WLn may be performed. A flow of the read operation of the third page read may also be applied to the read operations of the first page read and the second page read.

In an operation S1210, a first read operation of the third page read on the memory cell MC connected to the selected word line WLn may be performed. The first read operation may include three sensing operations on the seventh valley VA7. The first through third sensing operations F_SENSE, S_SENSE, and M_SENSE on the seventh valley VA7 may be performed sequentially. During the first sensing operation F_SENSE, data of a memory cell MC may be read using the first read voltage VR7_F, during the second sensing operation S_SENSE, data of a memory cell MC is read using the second read voltage VR7_S, in the third sensing operation M_SENSE, data of a memory cell MC may be read using the third read voltage VR7_M.

In an operation S1212, whether a data recover read operation DR_READ is needed may be determined based on read data of the first through third sensing operations F_SENSE, S_SENSE, and M_SENSE. An XOR operation may be performed on the read data of the first through third sensing operations F_SENSE, S_SENSE, and M_SENSE, and a result of the XOR operation may be counted, and a count value obtained from the count operation XCNT may be compared with the first and second reference values A and B. The comparing operation may be referred to as an OVS operation. According to a result of the OVS operation, a data recover read operation DR_READ on an upper word line WLn+1 that is adjacent to the selected word line WLn may be controlled.

Figure 13:
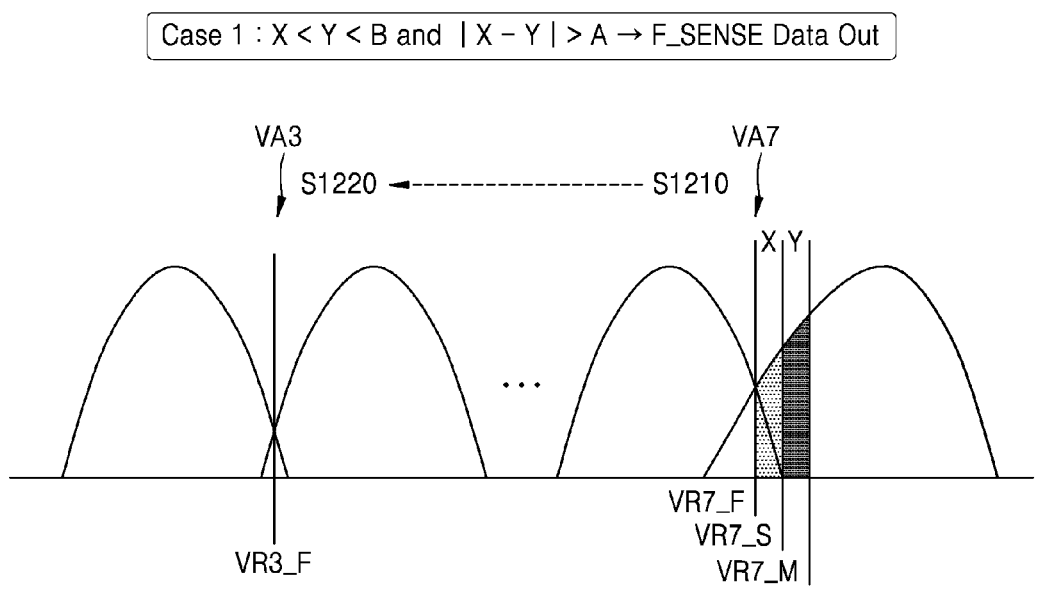
FIGS. 13 through 17 are views illustrating respective operations described with reference to FIG. 12 according to example embodiments.

When, as a comparison result of the operation S1212, the second count value Y is between the first count value X and the second reference value B (X<Y<B), and an absolute value of a difference between the first count value X and the second count value Y (|X−Y|) is determined to be greater than the first reference value A, the operation will proceed to an operation S1220 where a data recover read operation DR_READ is not necessary. In the operation S1220, a second read operation of the third page read on a memory cell MC connected to the selected word line WLn may be performed. The second read operation may include one time sensing operation in the sensing operation SENSE on the third valley VA3. As illustrated in FIG. 13, a read voltage used in the sensing operation SENSE of the third valley VA3 may be set to the first read voltage VR3_F corresponding to the first read voltage VR7_F of the seventh valley VA7. Next, the operation will proceed to an operation S1230.

Figure 14:
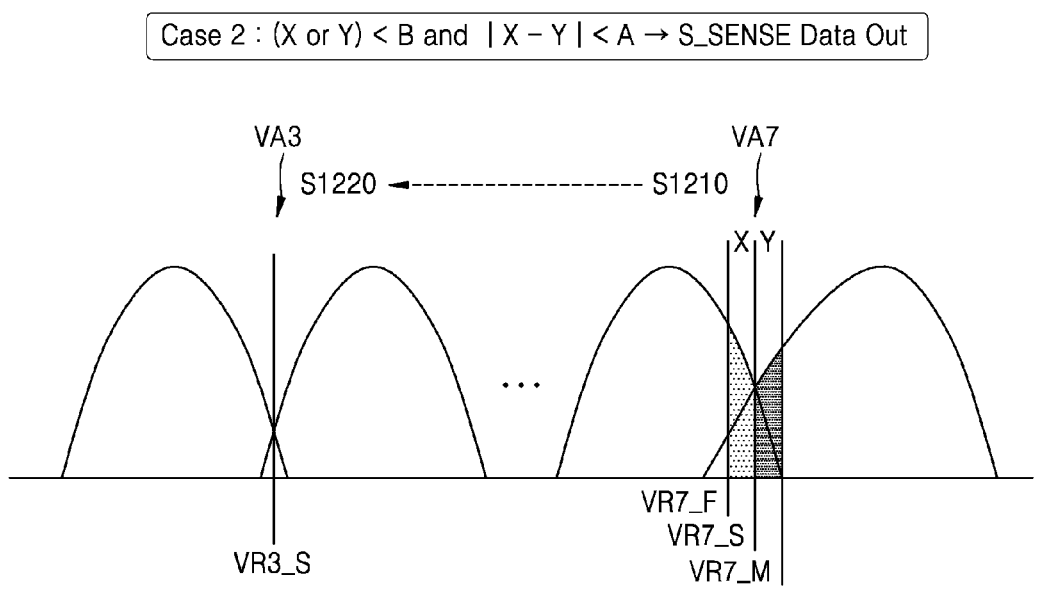

When, as a comparison result of the operation S1212, the first count value X or the second count value Y is determined to be smaller than the second reference value B ((X or Y)<B), and an absolute value of a difference between the first count value X and the second count value Y (|X−Y|) is determined to be smaller than the first reference value A, the operation will proceed to the operation S1220 where a data recover read operation DR_READ is not necessary. In the operation S1220, a second read operation of the third page read on the memory cell MC connected to the selected word line WLn may be performed. The second read operation may include one time sensing operation in the sensing operation SENSE on the third valley VA3. As illustrated in FIG. 14, a read voltage used in the sensing operation SENSE of the third valley VA3 may be set to the second read voltage VR3_S corresponding to the second read voltage VR7_S of the seventh valley VA7. Next, the operation will proceed to the operation S1230.

Figure 15:
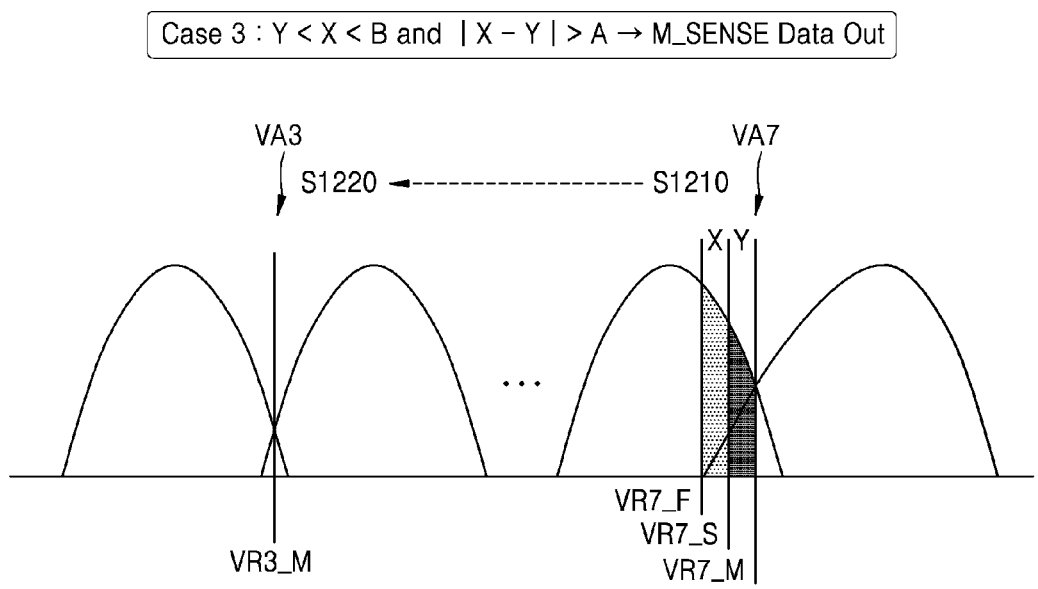

When, as a comparing result of the operation S1212, the first count value X is determined to be between the second count value Y and the second reference value B (Y<X<B), and an absolute value of a difference between the first count value X and the second count value Y (|X−Y|) is determined to be greater than the first reference value A, the method will proceed to the operation S1220 where a data recover read operation DR_READ is not necessary. In the operation S1220, a second read operation of the third page read on a memory cell MC connected to the selected word line WLn may be performed. The second read operation may include one time sensing operation in the sensing operation SENSE on the third valley VA3. As illustrated in FIG. 15, a read voltage used in the sensing operation SENSE of the third valley VA3 may be set to a third read voltage VR3_M corresponding to the third read voltage VR7_M of the seventh valley VA7. Next, the operation will proceed to the operation S1230.

When, as a comparing result of the operation S1212, the first count value X or the second count value Y is determined to be greater than the second reference value B ((X or Y)>B), the operation will proceed to an operation S1214 where a data recover read operation DR_READ is necessary.

In the operation S1214, as a result of comparison of the operation S1212, when the first count value X is determined to be smaller than the second count value Y, and when a threshold voltage shift of a selected word line WLn is determined to be deviated toward a relatively low threshold voltage due to word line coupling caused by an adjacent upper word line WLn+1, the operation will proceed to an operation S1222.

Figure 16:
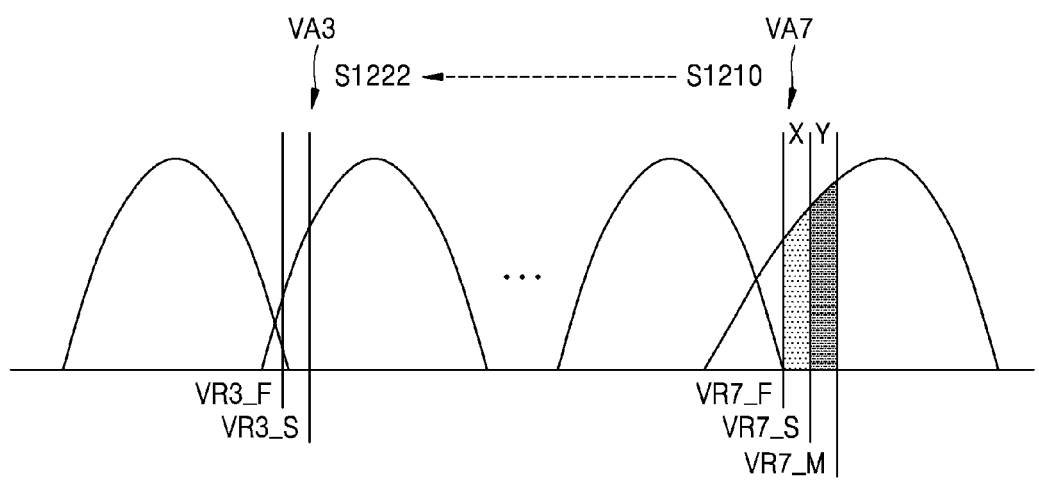

In the operation S1222, a second read operation of the third page read on a memory cell MC connected to a selected word line WLn may be performed. The second read operation may include two times sensing operations in the sensing operation SENSE on the third valley VA3. As illustrated in FIG. 16, first and second read voltages VR3_F and VR3_S corresponding to first and second read voltages VR7_F and VR7_S may be set. Next, the operation may proceed to an operation S1226.

In the operation S1214, as a result of comparison of the operation S1212, when the first count value X is determined to be greater than the second count value Y, and a threshold voltage shift of a selected word line WLn is determined to be deviated toward a relatively high threshold voltage due to word line coupling caused by the adjacent upper word line WLn+1, the operation will proceed to an operation S1224.

Figure 17:
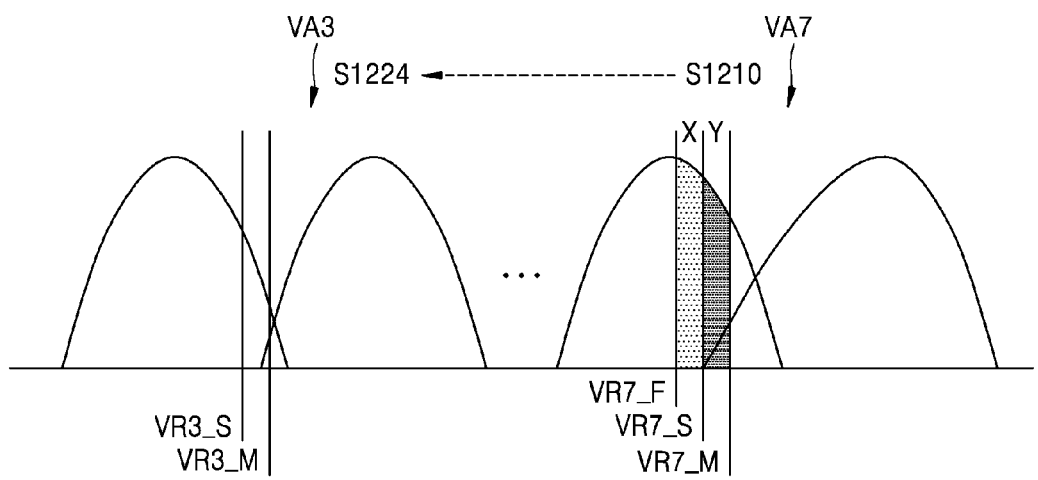

In the operation 1224, a second read operation of the third page read on a memory cell MC connected to the selected word line WLn may be performed. The second read operation may include two times sensing operations in the sensing operation SENSE on the third valley VA3. As illustrated in FIG. 17, second and third read voltages VR3_S and VR3_M corresponding to the second and third read voltages VR7_S and VR7_M of the seventh valley VA7 may be set. Next, the operation will proceed to the operation S1226.

In the operation S1226, a read operation on the upper word line WLn+1 adjacent to the selected word line WLn may be performed. A read operation on the upper word line WLn+1 may include at least one sensing operation. In example embodiments, in the sensing operation on the upper word line WLn+1, a read voltage may be set one of the first through seventh read voltages VR1 through VR7 of FIG. 5A. In other example embodiments, in the sensing operation on the upper word line WLn+1, a read voltage may be set to a predetermined voltage. The input/output circuit 126 may output data read at one of the three read voltages VR3_F, VR3_S, and VR3_M based on a program state of the upper word line WLn+1 that causes coupling or an amount of coupling. Next, the operation will proceed to the operation S1230.

In the operation S1230, data read in the read operation of the selected word line WL and/or data read in the read operation of the upper word line WLn+1 may be dumped from the page buffer unit 125 (FIG. 2) to the input/output circuit 126 (FIG. 2). Next, the input/output circuit 126 may output the dumped read data to the outside via the input/output line I/O.

Figure 18:
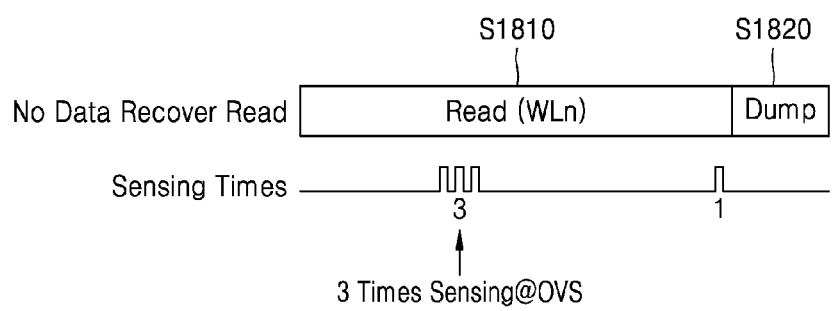
FIGS. 18 and 19 are views for describing the number of times to perform a sensing operation in a read operation according to example embodiments.
Figure 19:
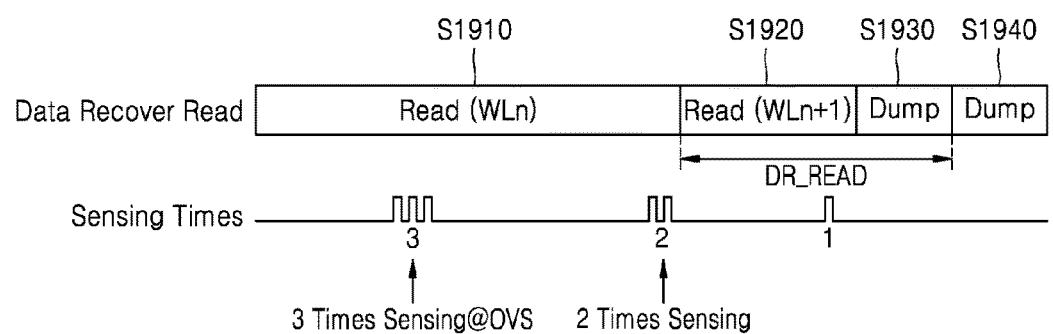

FIGS. 18 and 19 are views for describing the number of sensing operations in a read operation according to example embodiments. FIG. 18 describes the number of times to perform a sensing operation when a data recover read operation DR_READ is not necessary in the operation S1212, and FIG. 19 describes the number of times to perform a sensing operation when a data recover read operation DR_READ is necessary in the operation S1212.

Referring to FIG. 18, during a read operation S1810 of the third page read on a memory cell MC connected to a selected word line WLn, when a data recover read operation DR_READ is determined as not necessary, one sensing operation may be performed on the third valley VA3 at an optimum read voltage detected through three sensing operations on the seventh valley VA7. Data read during the read operation S1810 of the selected word line WL may be stored in the page buffer unit 125 and then dumped to the input/output circuit 126 in an operation S1820.

Referring to FIG. 19, in a read operation S1910 of the third page read on a memory cell MC connected to a selected word line WLn, when a data recover read operation DR_READ is determined as necessary, three sensing operations on the seventh valley VA7 and two sensing operations on the third valley VA3 may be performed. Next, the data recover read operation DR_READ may include a read operation S1920 performed on the adjacent upper word line WLn+1, including one sensing operation, and data read in the read operation S1920 on the upper word line WLn+1 may be stored in the page buffer unit 125 and then dumped to the input/output circuit 126 during an operation S1930. Also, the data read in the read operation S1910 of the selected word line WL may be stored in the page buffer unit 125 and then dumped to the input/output circuit 126 during the operation S1930. During an operation S1940, final data by performing the operation S1910 and S1920 may be dumped to the input/output circuit 126.

In example embodiments, the input/output circuit 126 may output data selected from data read by performing two sensing operations on the third valley VA3 based on a result of the data recover read operation DR_READ on the adjacent upper word line WLn+1. For example, when a program state of the adjacent upper word line WLn+1 is a high program state (e.g., a predetermined program state), the input/output circuit 126 may select data read by performing the second sensing operation at the second read voltage VR7_S in FIG. 11D, and data read by performing the third sensing operation at the third read voltage VR7_M in FIG. 11E.

Figure 20:
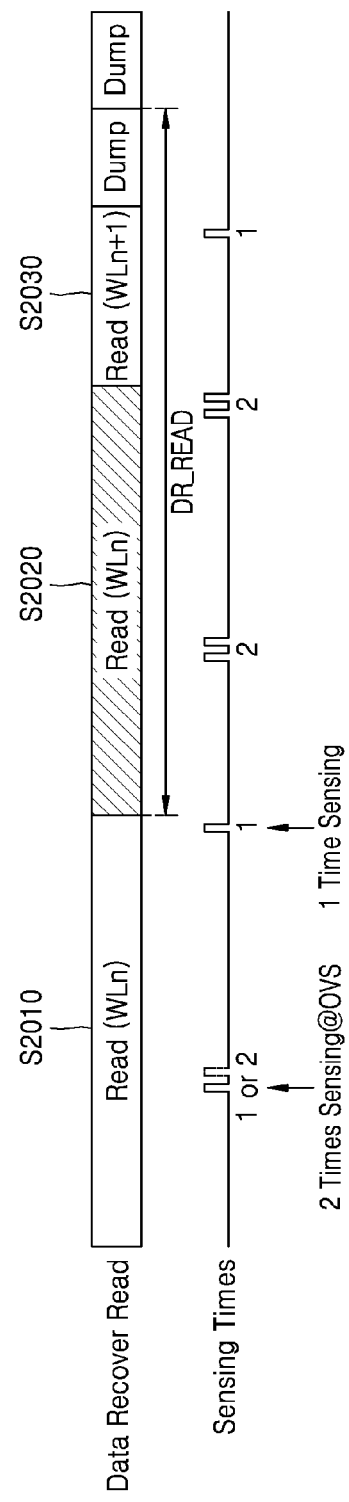
FIG. 20 is a view for describing a read operation described as a comparative example with respect to the example embodiment of FIG. 19.

FIG. 20 illustrates a read operation as a comparative example of the example embodiment of FIG. 19.

Referring to FIG. 20, compared to the data recover read operation DR_READ of FIG. 19, the data recover read operation DR_READ of FIG. 20 includes a read operation S2020 performed on a selected word line WLn and a read operation S2320 performed on an adjacent upper word line WLn+1. After the read operation S2010 on the selected word line WLn is performed via one or two sensing operations on the seventh valley VA7 and one sensing operation on the third valley VA3, the read operation S2020 on the selected word line WLn is repeatedly performed in the data recover read operation DR_READ.

Due to the repeated read operations S2010 and S1020 performed on the selected word line WLn, a duration of the data recover read operation DR_READ may be increased. The data recover read operation DR_READ is additionally performed to ensure reliability of the nonvolatile memory device 120. If the data recover read operation DR_READ, which is an additional operation, takes long time, high-speed read performance of the nonvolatile memory device 120 may be affected.

Figure 21:
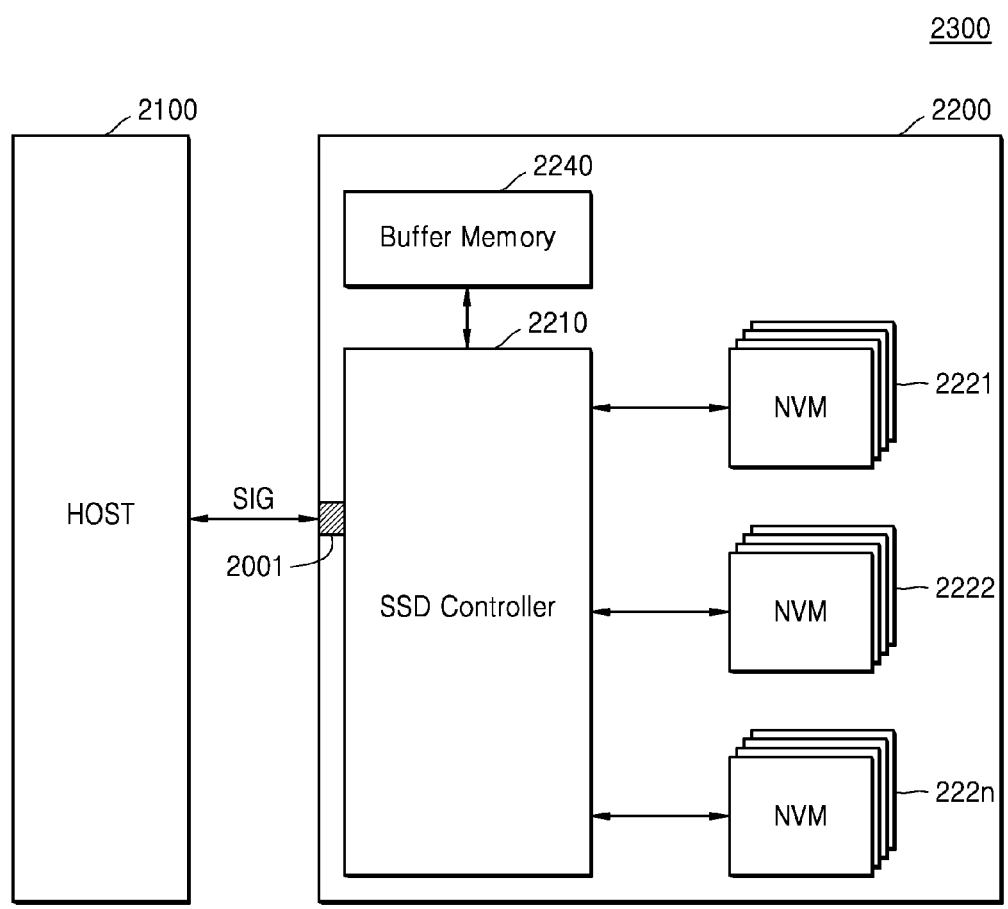
FIG. 21 is a block diagram illustrating a solid state drive (SSD) system in which a memory system performing an OVS operation and a recover read operation is applied according to example embodiments.

FIG. 21 is a block diagram illustrating a solid state drive (SSD) system in which a memory system performing an OVS operation and a recover read operation is applied according to example embodiments.

Referring to FIG. 21, the SSD system 2300 includes a host 2100 and an SSD 2200. The SSD 2200 transmits or receives a signal SIG with a host 2100 via a signal connector 2001. The SSD 2200 includes an SSD controller 2210, a plurality of flash memories 2221 through 222n, and a buffer memory 2240.

In response to the signal SIG received from the host 2100, the SSD controller 2210 may control the plurality of flash memories 2221 through 222n. For example, the flash memories 2221 through 222n may correspond to the nonvolatile memory device 120 described with reference to FIGS. 1 through 20. The flash memories 2221 through 222n may ensure that a read operation on a selected word line is not repeated in a data recover read operation, and control a sensing operation with an optimum read voltage via an OVS operation. The buffer memory 2240 operates as a buffer memory of the SSD 2200. For example, the buffer memory 2240 may temporarily store data received from the host 2100 or data received from the plurality of flash memories 2221 through 222n, or may temporarily store a refresh read controller 2214 implemented as a software layer.

While the inventive concept has been particularly shown and described with reference to embodiments thereof, it will be understood that various changes in form and details may be made therein without departing from the spirit and scope of the following claims.

What is claimed is:

1. A read method for a nonvolatile memory device including a plurality of memory cells each storing M-bit data (M is 3 or more), the read method comprising:
   reading data of a first set of memory cells connected to a first word line, by dividing the data of the first set of memory cells into M pages and individually reading data from the M pages, wherein the reading data of the first set of memory cells comprises:
   performing an on-chip valley search (OVS) operation within the nonvolatile memory device, wherein during the OVS operation, a read voltage with respect to a first valley of two adjacent threshold voltage distributions of the first set of memory cells corresponding to each of first through Mth pages is determined;
   determining a number of times to perform a sensing operation of a second valley of two adjacent threshold voltage distributions based on a result of the OVS operation of the first valley; and
   selectively performing a data recover read operation on a second word line adjacent to the first word line based on a result of the OVS operation.

2. The read method of claim 1, wherein the performing of the OVS operation comprises:
   performing a first sensing operation in which data of the first set of memory cells is read at a first read voltage;
   performing a second sensing operation in which data of the first set of memory cells is read at a second read voltage higher than the first read voltage;
   performing a third sensing operation in which data of the first set of memory cells is read at a third read voltage higher than the second read voltage;
   determining a read voltage of the first valley, on which the OVS operation is performed, based on data read from the first through third sensing operations; and
   determining a read voltage on a second valley of two adjacent threshold voltage distributions of each page read based on the determined read voltage of the first valley.

3. The read method of claim 2, wherein the determining of the read voltage of the first valley comprises:
   performing a first XOR operation on data read during the first sensing operation and data read during the second sensing operation;
   counting a number of '1' from a result of the first XOR operation and storing the counted number of '1' as a first count value;
   performing a second XOR operation on data read during the second sensing operation and data read during the third sensing operation;
   counting a number of '1' from a result of the second XOR operation and storing the counted number of '1' as a second count value; and
   comparing the first count value and the second count value with first and second reference values.

4. The read method of claim 3, wherein the first reference value is a parameter used to determine which of the read data of the first through third sensing operations is to be selected and output, and
   wherein the second reference value is a parameter used to determine whether to perform the data recover read operation.

5. The read method of claim 4, wherein in the determining of the read voltage with respect to the second valley, when the second count value is determined to be between the first count value and the second reference value, and an absolute value of a difference between the first count value and the second count value is determined to be greater than the first reference value, a read voltage with respect to the second valley is set to the first read voltage.

6. The read method of claim 4, wherein in the determining of the read voltage with respect to the second valley, when the first count value or the second count value is determined to be smaller than the second reference value, and an absolute value of a difference between the first count value and the second count value is determined to be smaller than the first reference value, a read voltage with respect to the second valley is set to the second read voltage.

7. The read method of claim 4, wherein in the determining of the read voltage with respect to the second valley, when the first count value is determined to be between the second count value and the second reference value, and an absolute value of a difference between the first count value and the second count value is determined to be greater than the first reference value, a read voltage with respect to the second valley is set to the third read voltage.

8. The read method of claim 4, wherein in the determining of the read voltage with respect to the second valley, when the first count value or the second count value is determined to be greater than the second reference value, and the first count value is determined to be smaller than the second count value, a read voltage with respect to the second valley is set to the first and second read voltages.

9. The read method of claim 4, wherein in the determining of the read voltage with respect to the second valley, when the first count value or the second count value is determined to be greater than the second reference value, and the first count value is determined to be greater than the second count value, a read voltage with respect to the second valley is set to the second and third read voltages.

10. The read method of claim 1, wherein when the data recover read operation is performed, a read operation on the first word line is not performed during the data recover read operation.

11. A nonvolatile memory device comprising:
a memory cell array including a plurality of memory cells each configured to store M-bit data, arranged in rows and columns, where M is 3 or more;
a page buffer unit coupled to the memory cell array, configured to read data of the plurality of memory cells from the memory cell array; and
a control logic unit coupled to the page buffer unit, configured to read data of a first set of memory cells connected to a first word line, by individually reading data of M pages of the first set of memory cells, perform an on-chip valley search (OVS) operation on a first valley of two adjacent threshold voltage distributions of the first set of memory cells when reading each of the M pages, through N sensing operations, where N is 3 or more, determine whether to perform a data recover read operation on a second word line adjacent to the first word line, based on a result of the OVS operation, and determine a number of times to perform a sensing operation of a second valley of two adjacent threshold voltage distributions of the first set of memory cells.

12. The nonvolatile memory device of claim 11, wherein when the data recover read operation is determined to be performed, the control logic unit controls the data recover read operation such that a read operation on the first word line is not performed during the data recover read operation.

13. The nonvolatile memory device of claim 11, wherein when the data recover read operation is determined to not be performed, the control logic unit sets the number of times to perform a sensing operation of the second valley, to one time.

14. The nonvolatile memory device of claim 11, wherein when the data recover read operation is determined to be performed, the control logic unit sets the number of times to perform a sensing operation of the second valley to (N−1) times.

15. The nonvolatile memory device of claim 14, wherein the (N−1) times to perform a sensing operation of the second valley are performed using read voltages corresponding to low side (N−1) read voltages in which a lowest read voltage is included from among read voltages used in the N sensing operations.

16. The nonvolatile memory device of claim 14, wherein the (N−1) times to perform a sensing operation of the second valley are performed using read voltages corresponding to high side (N−1) read voltages in which a highest read voltage is included from among read voltages used in the N sensing operations.

17. A read method for a nonvolatile memory device including a plurality of memory cells connected to a plurality of word lines, the read method comprising:
reading data of a first set of memory cells connected to a first word line, wherein reading the data of the first set of memory cells comprises:
performing an on-chip valley search (OVS) operation by sequentially performing three sensing operations at three respective read voltages for a first valley of two adjacent threshold voltage distributions of the first set of memory cells;
based on a first result of the OVS operation, performing one sensing operation at one read voltage selected from the three respective read voltages for a second valley of two adjacent threshold voltage distributions of the first set of memory cells; and
based on a second result of the OVS operation different from the first result, sequentially performing two sensing operations at two respective read voltages selected from the three respective read voltages for the second valley.

18. The read method of claim 17, further comprising:
performing a data recover read operation at a predetermined read voltage on a second word line adjacent to the first word line based on the second result of the OVS operation.

19. The read method of claim 18, further comprising:
outputting data read by performing one sensing operation of the two sensing operations, wherein the data is selected based on a program state of a memory cell connected to the second word line.

20. The read method of claim 17, wherein the three respective read voltages are a first read voltage, a second read voltage greater than the first read voltage, and a third read voltage greater than the second read voltage,
wherein the performing of the OVS operation comprises:
performing a first sensing operation in which data of the first set of memory cells is read at the first read voltage;
performing a second sensing operation in which data of the first set of memory cells is read at the second read voltage;
performing a third sensing operation in which data of the first set of memory cells is read at the third read voltage;
counting a number of first memory cells of the first set of memory cells having threshold voltages between the first read voltage and the second read voltage and storing the counted value of the first memory cells as a first count value; and
counting a number of second memory cells of the first set of memory cells having threshold voltages between the second read voltage and the third read voltage and storing the counted value of the second memory cells as a second count value.

21. The read method of claim 20, wherein the OVS operation results in the first result when a difference value between the first count value and the second count value is smaller or greater than a first reference value, and each of the first count value and the second count value is smaller than a second reference value, and wherein the OVS operation results in the second result when the first count value is greater or smaller than the second count value, and each of the first count value and the second count value is greater than the second reference value.

\* \* \* \* \*